United States Patent
Brusberg

(10) Patent No.: US 10,459,160 B2
(45) Date of Patent: Oct. 29, 2019

(54) GLASS WAVEGUIDE ASSEMBLIES FOR OE-PCBS AND METHODS OF FORMING OE-PCBS

(71) Applicant: Corning Optical Communications LLC, Hickory, NC (US)

(72) Inventor: Lars Martin Otfried Brusberg, Corning, NY (US)

(73) Assignee: Corning Optical Communications LLC, Charlotte, NC (US)

( * ) Notice: Subject to any disclaimer, the term of this patent is extended or adjusted under 35 U.S.C. 154(b) by 0 days.

(21) Appl. No.: 15/420,549

(22) Filed: Jan. 31, 2017

(65) Prior Publication Data
US 2018/0217326 A1    Aug. 2, 2018

(51) Int. Cl.
*G02B 6/122* (2006.01)
*G02B 6/42* (2006.01)
(Continued)

(52) U.S. Cl.
CPC .......... *G02B 6/122* (2013.01); *G02B 6/1345* (2013.01); *G02B 6/30* (2013.01); *G02B 6/4204* (2013.01); *G02B 6/428* (2013.01); *H05K 1/0274* (2013.01); *H05K 1/18* (2013.01); *G02B 6/4214* (2013.01); *G02B 6/4249* (2013.01); *G02B 6/43* (2013.01);
(Continued)

(58) Field of Classification Search
CPC ...... G02B 6/122; G02B 6/4204; G02B 6/428; G02B 6/1345; G02B 6/30; G02B 6/43; G02B 6/4249; G02B 6/4214; G02N 2006/12183; G02N 2006/12038;
(Continued)

(56) References Cited

U.S. PATENT DOCUMENTS 5,902,435 A    5/1999    Meis et al.
6,005,991 A    12/1999   Knasel
(Continued)

FOREIGN PATENT DOCUMENTS

EP    1155348 B1    6/2003
JP    2004046031 A    2/2004
(Continued)

OTHER PUBLICATIONS

Adikan, Faisal Rafiq Mahamd, et al. "Direct UV written optical waveguides in flexible glass flat fiber chips." Selected Topics in Quantum Electronics, IEEE Journal of 18.5 (2012): 1534-1539.
(Continued)

*Primary Examiner* — Ryan A Lepisto
*Assistant Examiner* — Erin D Chiem
(74) *Attorney, Agent, or Firm* — Adam R. Weeks

(57) ABSTRACT

The glass waveguide assembly includes a substrate with glass optical waveguides formed in the body of the glass substrate without adding or removing any glass from the substrate body. The glass optical waveguides run generally from a front-end section to a back-end section. A protective coating is formed over at least a portion of the top surface of the glass substrate where the glass optical waveguides reside. Optical connectors are formed at or adjacent the back end at corresponding connector regions. Each connector includes an end portion of at least one of the glass optical waveguides. In some configurations, the glass waveguide assembly includes a bend section that facilitates forming an optical interconnection in a photonic system between an optical-electrical printed circuit board and photonic integrated circuit.

27 Claims, 17 Drawing Sheets

(51) Int. Cl.
*G02B 6/30* (2006.01)
*G02B 6/12* (2006.01)
*G02B 6/43* (2006.01)
*H05K 1/18* (2006.01)
*H05K 1/02* (2006.01)
*G02B 6/134* (2006.01)

(52) U.S. Cl.
CPC ............ *G02B 2006/12038* (2013.01); *G02B 2006/12102* (2013.01); *G02B 2006/12183* (2013.01); *H05K 1/189* (2013.01); *H05K 2201/053* (2013.01); *H05K 2201/10446* (2013.01)

(58) Field of Classification Search
CPC ........... G02N 2006/12102; H05K 1/18; H05K 1/0274; H05K 2201/10446; H05K 2201/053
See application file for complete search history.

(56) References Cited

U.S. PATENT DOCUMENTS

| | | | |
|---|---|---|---|
| 6,091,874 | A | 7/2000 | Higashi et al. |
| 6,233,376 | B1 | 5/2001 | Updegrove |
| 6,343,171 | B1 | 1/2002 | Yoshimura et al. |
| 6,442,323 | B1 | 8/2002 | Sorosiak et al. |
| 6,850,671 | B2 | 2/2005 | Carnevale et al. |
| 6,905,569 | B2 | 6/2005 | Kim et al. |
| 7,120,345 | B2 | 10/2006 | Naitou et al. |
| 7,130,498 | B2 | 10/2006 | Meis et al. |
| 7,139,448 | B2 | 11/2006 | Jain et al. |
| 7,454,098 | B1 | 11/2008 | Lamprecht et al. |
| 7,532,782 | B2 | 5/2009 | Bragg et al. |
| 7,684,663 | B2 | 3/2010 | Deane |
| 7,717,628 | B2 | 5/2010 | Hwang et al. |
| 8,155,493 | B2 | 4/2012 | Ushiwata et al. |
| 2003/0010530 | A1 | 1/2003 | Scheel et al. |
| 2016/0131837 | A1 | 5/2016 | Mahgerefteh et al. |
| 2016/0238786 | A1 | 8/2016 | Garner et al. |

FOREIGN PATENT DOCUMENTS

| | | |
|---|---|---|
| WO | 2002031566 A1 | 4/2002 |
| WO | 2015061185 A1 | 4/2015 |

OTHER PUBLICATIONS

G. Gardiner, "Printed circuit boards: A mobile market" in Composites World (2016) http://www.compositesworld.com/articles/printed-circuit-boards-a-mobile-market.

H. Schroder, N. Arndt-Staufenbiel, M. Cygon and W. Scheel, "Planar glass waveguides for High performance electrical-optical-circuit-boards (EOCB)—the glass-layer-concept," Electronic Components and Technology Conference, 2003. Proceedings. 53rd, 2003, pp. 1053-1059.

L. Brusberg, D. Manessis, C. Herbst, M. Neitz, B. Schild, M. Topper, H. Schröder, and T. Tekin, "Single-mode board-level interconnects for silicon photonics," in Optical Fiber Communication Conference, OSA Technical Digest (online) (Optical Society of America, 2015), paper W2A.56.

L. Brusberg, H. Schröder, C. Herbst, C. Frey, C. Fiebig, A. Zakharian, S. Kuchinsky, X. Liu, D. Fortusini, A. Evans, "High Performance Ion-Exchanged Integrated Waveguides in Thin Glass for Board-Level Multimode Optical Interconnects" Proc. of European Conference on Optical Communication (ECOC), Valencia, Spain, Sep. 27-Oct. 1, 2015.

L. Brusberg, H. Schröder, C. Ranzinger, M. Queisser, C. Herbst, S. Marx, J. Hofmann, M. Neitz, D. Pernthaler, K.-D. Lang, "Thin glass based electro-optical circuit board (EOCB) with through glass vias, gradient-index multimode optical waveguides and collimated beam mid-board coupling interfaces" Proc. of 65th Electronic Components and Technology Conference (ECTC), San Diego, CA, USA, May 26-29, 2015.

La Porta et al., "Silicon photonics packaging for highly scalable optical interconnects," 2015 IEEE 65th Electronic Components and Technology Conference (ECTC), San Diego, CA, pp. 1299-1304 (2015).

R. C. A. Pitwon et al., "Pluggable Electro-Optical Circuit Board Interconnect Based on Embedded Graded-Index Planar Glass Waveguides," in Journal of Lightwave Technology, vol. 33, No. 4, pp. 741-754, Feb. 15, 2015.

Sheng Huang, Mingshan Li, Sean M. Garner, Ming-Jun Li, and Kevin P. Chen, "Flexible photonic components in glass substrates," Opt. Express 23, 22532-22543 (2015).

International Search Report and Written Opinion PCT/2018/013108 dated Apr. 20, 2018.

Schroder et al. "Strategies for glass based photonic system integration" Proceedings of the 5th Electronics System-Integration Technology Conference, Sep. 2014. pp. 1-7.

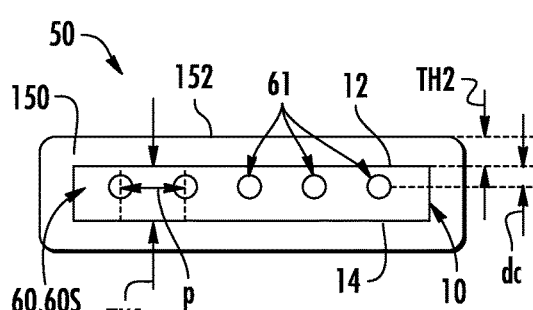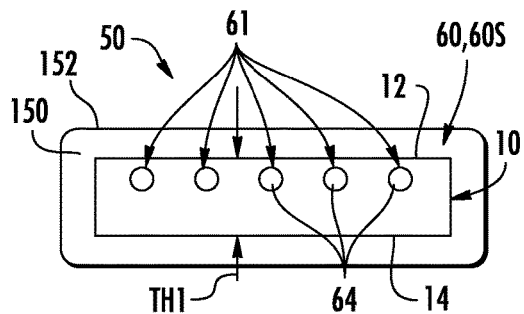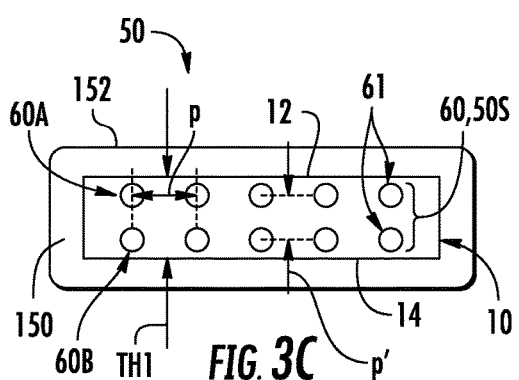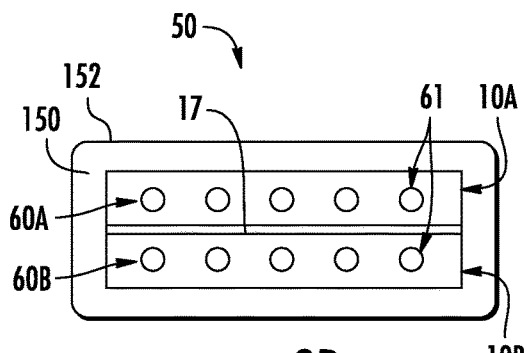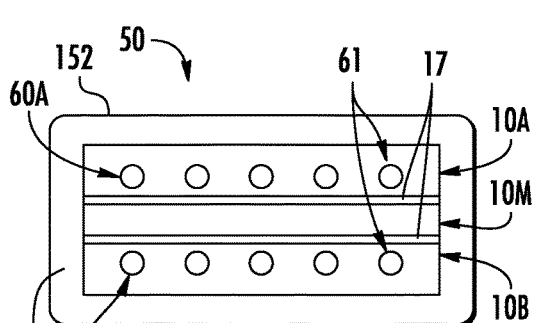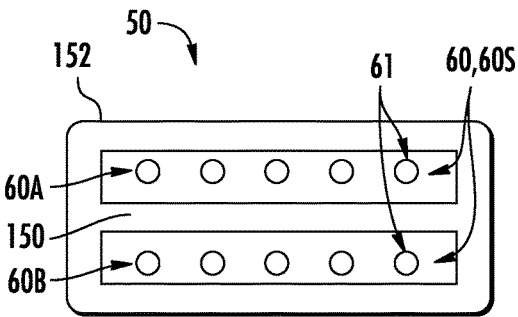
FIG. 3A
FIG. 3B
FIG. 3C
FIG. 3D
FIG. 3E
FIG. 3F

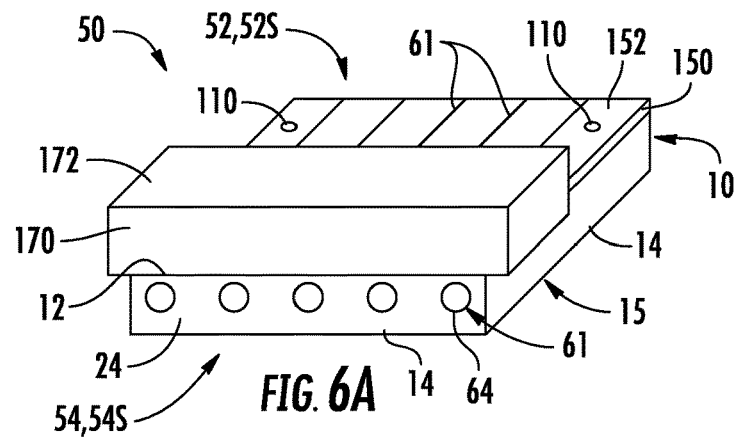
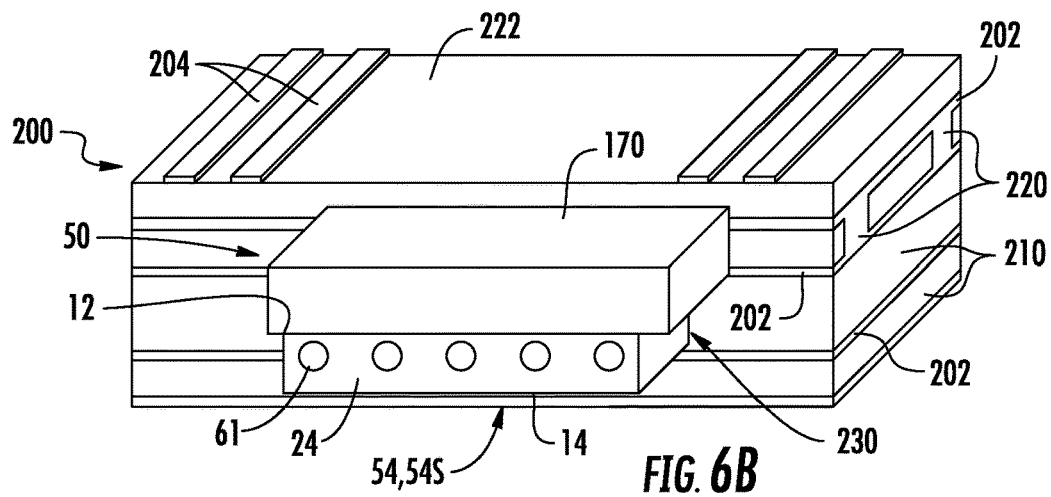
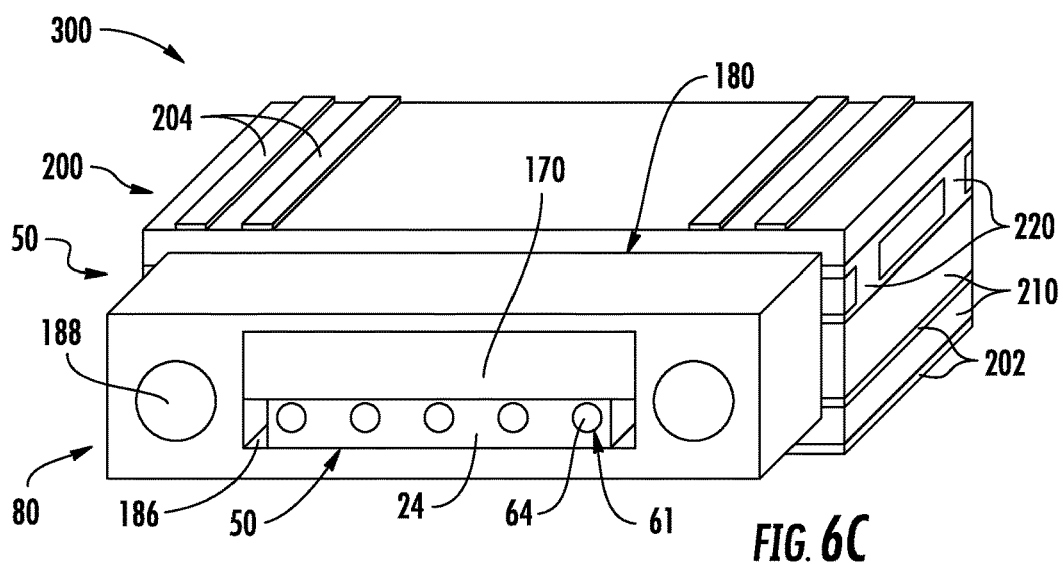

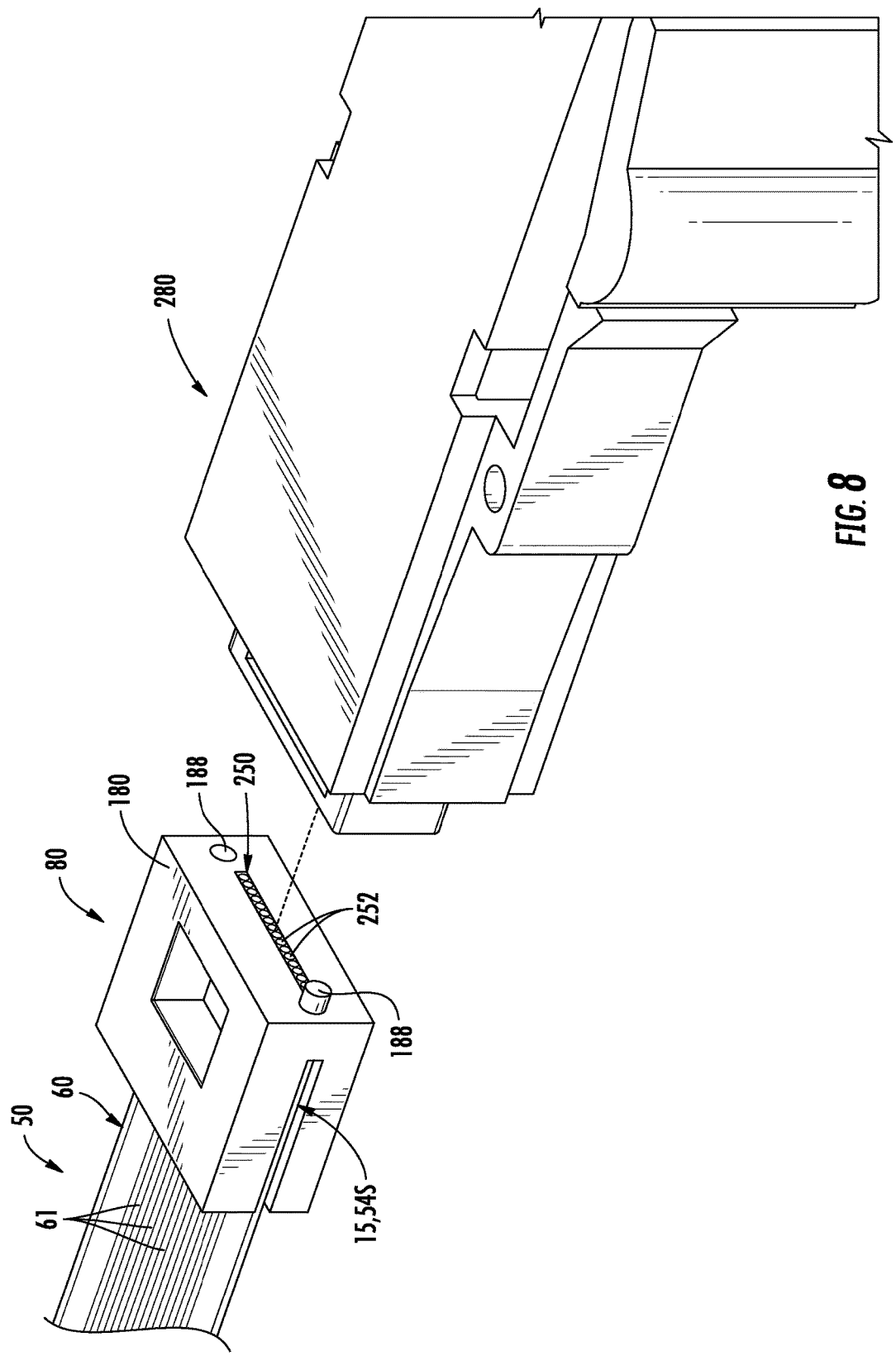

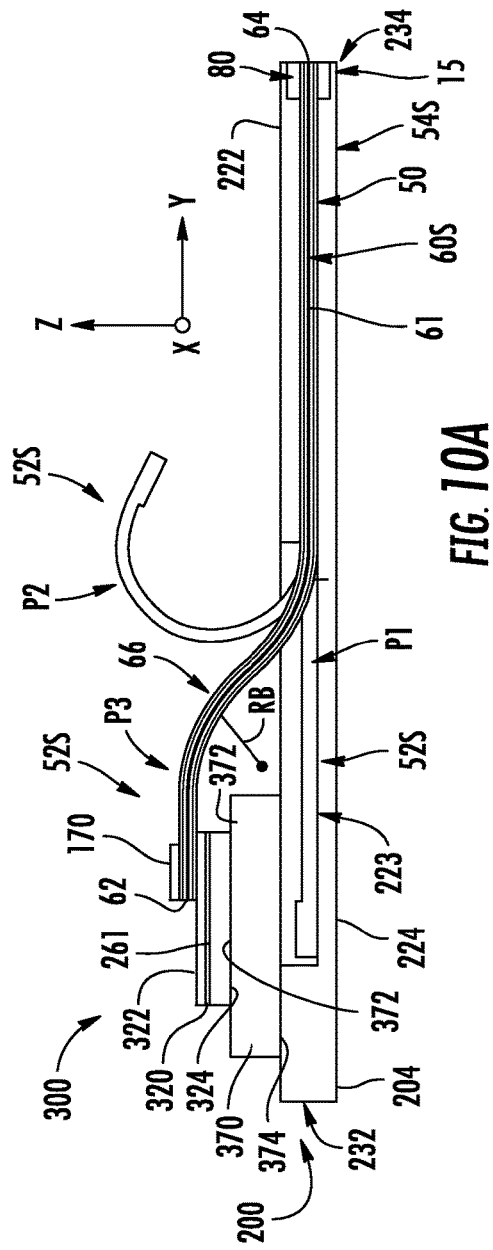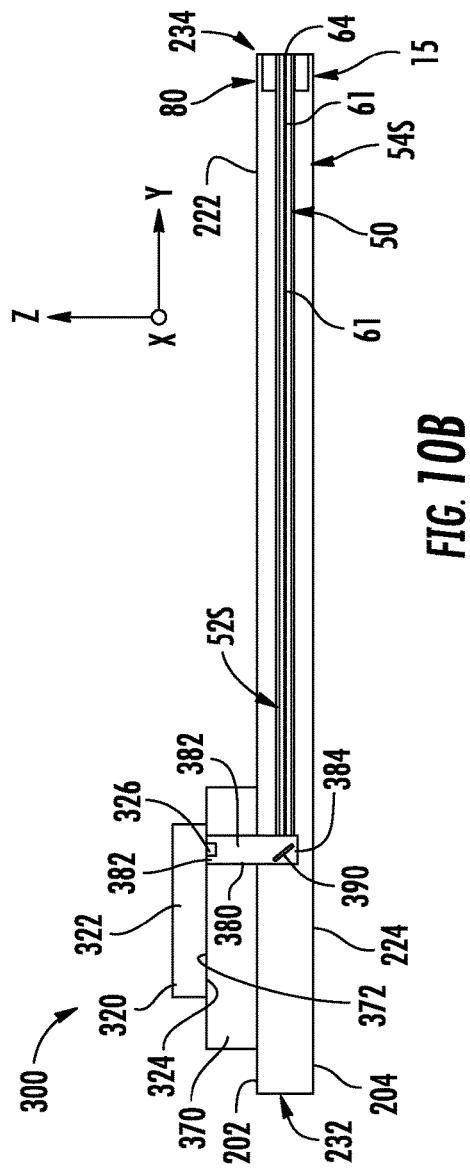

GLASS WAVEGUIDE ASSEMBLIES FOR OE-PCBS AND METHODS OF FORMING OE-PCBS

FIELD

The present disclosure relates to optical-electrical printed circuit boards (OE-PCBs), and in particular relates to glass waveguide assemblies for OE-PCBs and methods of forming OE-PCBs.

BACKGROUND

Photonic systems are based on the generation, manipulation and/or detection of light much in the way electronic systems are based on generation, manipulation and/or detection of electricity. Photonic systems can also be based on the generation, manipulation and/or detection of both light and electricity, in which case they are sometimes referred to as opto-electronic systems.

A key component of photonic systems is an OE-PCB. The OE-PCB typically includes optical waveguides to conduct light much in the way conventional electrical-based PCBs use wiring to conduct electricity. The OE-PCB also includes electrical wires and components usually associated with conventional electrical-based PCBs. The OE-PCB can also include optical components such light emitters, light detectors, light-redirecting elements, optical waveguides, filters, etc.

OE-PCBs can be formed by adding optical functionality to an electrical-based PCB (hereinafter, just PCB). This includes among other things defining waveguides and optical components on substrates and then incorporating the substrates into the PCB to form the OE-PCB. To date this has proven to be relatively complex and costly due in large measure to the glass substrates not being sufficiently compatible with standard PCB fabrication and assembly techniques. The result has been that the fabrication of the optical components of the OE-PCB have been divorced from the PCB fabrication process and the use of existing PCB fabrication methods and tools. This has resulted in manufacturing inefficiencies, fabrication complexity, relatively low yield and high cost for OE-PCBs.

SUMMARY

The disclosure relates to glass waveguide assemblies for use in forming OE-PCBs. In various, examples, the OE-PCBs have embedded optical interconnects or fly-over optical interconnects or optical cables.

A glass sheet is used to form the OE-PCBs. Optical, mechanical, and/or electrical features are preferably added to the glass sheet prior to PCB fabrication and integration so that the glass waveguide assembly is compatible with standard PCB equipment and processes such as lamination, mechanical drilling and milling, laser drilling, and chemical processing like copper etching and plating. The glass waveguide assembly is also compatible with standard PCB transport, handling and storage routines and avoids the need for specialist operators taking care of fragile glass processing. The glass substrate can be handled in the same way as glass-reinforced epoxy laminate sheets or other standard laminates used for PCB fabrication. With thickness below 300 microns, roll-to-roll processes can be applied with flexible glass.

The glass waveguide assembly is preferably fabricated in its entirety prior to PCB integration to simplify the OE-PCB fabrication process, increase throughput and allow for the use of established PCB processes when adding glass layers to the PCB. The glass waveguide assembly is made of a sheet of glass that has integrated single mode or multimode glass optical waveguides formed therein.

One or multiple glass waveguide assemblies can be combined with other PCB processes to fabricate the OE-PCB. The use of a protective coating on one or more portions of the glass waveguide assembly protects the components thereon and allows for processing using standard PCB processing techniques.

An embodiment of the disclosure is a glass waveguide assembly. The glass waveguide assembly includes a glass substrate comprising a body with a front-end section having a front end, a back-end section having a back end, a top surface, a bottom surface, and at least one connector region adjacent the back end. At least one glass optical waveguide is formed in the body of the glass substrate and runs generally from the front-end section to the back-end section. A protective coating is formed over at least a portion of the top surface adjacent to the at least one glass optical waveguide resides. The glass waveguide assembly also includes at least one optical connector formed at or adjacent the back end at the at least one connector region and that includes an end portion of the at least one glass optical waveguide.

Another embodiment of the disclosure is a glass waveguide assembly that includes: a glass substrate defined by a body having a top surface, a front-end section with a front-end and a back-end section with a back end; one or more glass optical waveguides, with each glass optical waveguide having respective front and back ends and being formed within the body of the glass substrate; one or more connectors operably arranged at the back ends of the glass optical waveguides to define an exposed portion of the glass substrate; and a protective coating made of a dielectric material and that coats at least one or more exposed portions of the top surface of the glass substrate.

Another embodiment of the disclosure is an OE-PCB that includes one of the glass waveguide assemblies as briefly described above and as described in greater detail below, and a PCB that operably supports the glass waveguide assembly.

Another embodiment of the disclosure is a method of forming an OE-PCB that includes a PCB and a photonic integrated circuit (PIC) having at least one photonic device. The method comprises forming from a glass substrate having a body a glass waveguide assembly having a front-end section with a front-end and a back-end section with a back end. The method also comprises forming at least one glass optical waveguide having respective front and back ends and being formed by selectively modifying the glass of the glass body using at least one of an ion-exchange process and a laser-writing process; connectorizing the back end of the at least one glass optical waveguide using at least one connector; and coating at least a portion of the top surface of the glass substrate with a protective coating made of a dielectric material; supporting at least the back-end section of the glass waveguide assembly within or adjacent the PCB; and disposing the front-end section of the glass waveguide assembly relative to the PIC so that the at least one glass optical waveguide is in optical communication with the at least one photonic device.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIGS. 3A through 3L are x-z cross-sectional views of the glass waveguide assembly illustrating different configurations for an example array of glass optical waveguides;

FIGS. 6A through 6C are elevated views illustrating an example of how a glass waveguide assembly (FIG. 6A) can be incorporated into a PCB structure and connectorized as part of the process of forming an OE-PCB (FIG. 6C);

FIG. 8 is an elevated view of a connectorized glass waveguide assembly wherein the connector supports the microlens assembly and is shown in a position to be operably engaged with a multi-fiber connector;

FIG. 10A is similar to FIG. 9 and shows an example OE-PCB in three different stages of fabrication and the corresponding positions of the front-end section of the glass waveguide assembly during the fabrication process;

FIG. 10B is similar to FIG. 10A and illustrates an example OE-PCB wherein the glass waveguide assembly is embedded as a layer of the PCB and wherein an optical via is used to define an optical path between the glass optical waveguides of the glass waveguide assembly and a PIC supported by an interposer;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation.

The acronym "MT" means "mechanical transfer" and is used to describe a type of multi-fiber optical fiber connector, in which two mechanical pins dictate the alignment of the optical fibers, or in the present disclosure a multi-waveguide connector. The typical outer dimensions of a MT fiber ferrule are 8 mm×7 mm×3 mm and the guiding pins have a diameter of 700 microns.

The acronym "MPO" connector means "multi-fiber push-on" and is also used to described a type of multi-fiber connector or in the present disclosure a multi-waveguide connector. The IEC-61754-7 standard is the commonly cited standard for MPO connectors.

The acronym PIC stands for "photonic integrated circuit."

The acronym PLC stands for "planar lightwave circuit" and is considered herein as a type of PIC.

Glass Substrate for Glass Waveguide Assembly

Figure 1:
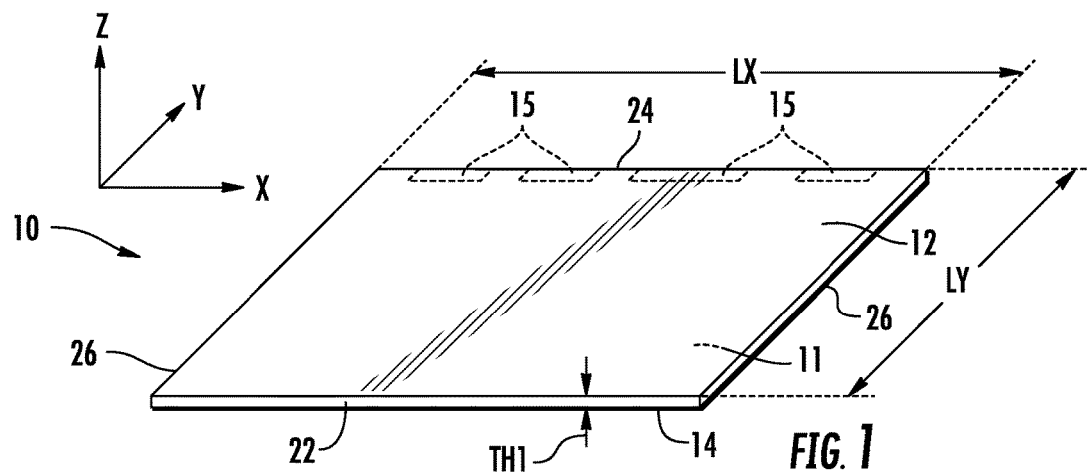
FIG. 1 is an elevated view of a glass substrate used to form the glass waveguide assemblies disclosed herein.

FIG. 1 is an elevated view of a glass substrate 10 used to form the glass waveguide assemblies disclosed herein. The glass substrate 10 is (at least initially) in the form of a planar sheet and has a body 11 that includes a top surface 12, a bottom surface 14, a front end 22, a back end 24 and sides 26. The body 11 is defined by a glass matrix.

The glass substrate 10 has a thickness TH1, which can vary with position, as discussed below. In an example, the thickness TH1 is between 20 microns and 500 microns. The glass substrate 10 also has dimensions LX and LY, where LX is a "width" and LY is a "length." In one example, the length LY is in the range from 2 cm to 10 cm. In other examples, the length LY can be substantially longer, such as for making optical interconnections between boards or cards of an optical communication device, as discussed below in connection with FIGS. 11A through 11C. The width LX can be any reasonable width needed to accommodate the desired number of glass optical waveguides, as discussed below.

In an example, glass substrate 10 is made of ion-exchangeable glass, i.e., one that contains alkali ions such as $Na^+$. An example material for glass substrate 10 is a chemically strengthened glass or a glass suitable for chemical strengthening. An example of such a glass is Gorilla® glass, available from Corning, Inc., Corning, N.Y. Another example material is a flexible glass such as Willow® glass, available from Corning, Inc., Corning, N.Y. In an example, glass substrate 10 is made of a $K^+$ ion-exchanged glass, e.g., where $K^+$ has been exchanged for $Na^+$ in the glass substrate.

The glass substrate 10 includes adjacent back end 24 at least one connector region 15, which includes portions of the top and bottom surfaces 12 and 14 where at least one connector is formed, as explained below.

Glass Waveguide Assembly

Figure 2A:
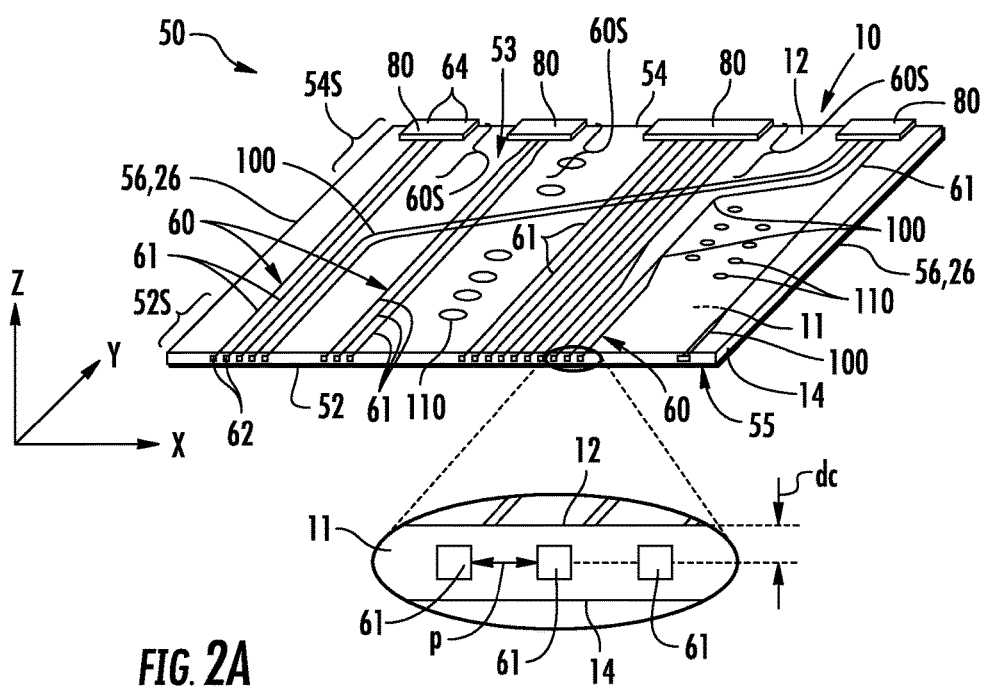
FIG. 2A is an elevated view of an example of a partially fabricated glass waveguide assembly as formed from the glass substrate of FIG. 1.
Figure 2B:
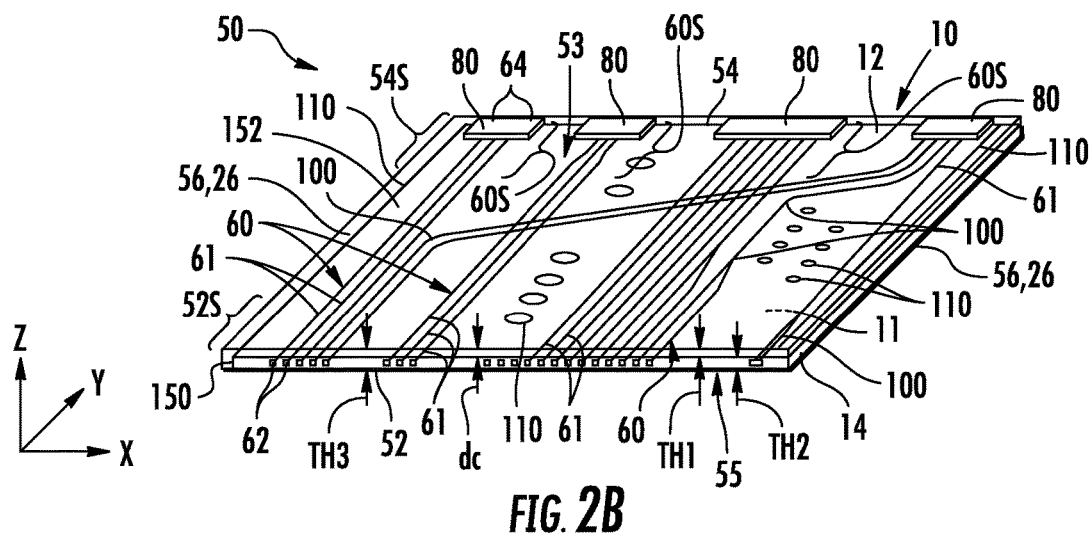
FIG. 2B is similar to FIG. 2A and shows the fully fabricated glass waveguide assembly formed by adding a protective coating.

FIG. 2A is an elevated view of an example of a partially fabricated glass waveguide assembly 50 as formed from the glass substrate 10 of FIG. 1. FIG. 2B is similar to FIG. 2A and shows the fully fabricated glass waveguide assembly 50. The glass waveguide assembly 50 has a front end 52, a back end 54 and sides 56 that respectively correspond to the front end 22, the back end 24 and sides 26 of glass substrate 10. The glass waveguide assembly 50 also includes a top side 53 and a bottom side 55. The glass waveguide assembly 50 also includes a front-end section 52S that includes front end 52 and a back-end section 54S that includes back end 54.

With reference to FIGS. 2A and 2B, the glass waveguide assembly 50 includes at least one glass optical waveguide ("waveguide") 61. The at least one waveguide 61 can define a waveguide array 60, which in examples can include multiple waveguides 61. The discussion below makes reference to multiple waveguides 61 as well as to one or more waveguide arrays 60 by way of illustration.

The waveguides 61 are formed within body 11 and run generally in the y-direction from at or near front end 22 to at or near back end 24 of glass substrate 10. Each waveguide 61 includes a front end 62 at or adjacent the front end 22 of glass substrate 10 and a back end 64 at or near back end 24 of the glass substrate. The waveguide array 60 includes a back-end section 60S that includes waveguide back ends 64. The waveguides 61 can also run from front end 22 of glass substrate 10 or back end 24 of the glass substrate to one of sides 26 of the glass substrate, e.g., by a combination of straight and/or curved waveguide sections.

The waveguides 61 are formed from glass, and in particular are formed within the glass matrix of body 11 by modifying the glass composition. In an example, this modification is accomplished by ion diffusion or by laser writing or by a combination thereof. Thus, in an example, waveguides 61 are formed within body 11 of glass substrate 10 without removing any glass from the body or adding any glass to the body. Here it is noted that ion-diffusion does not result in the removal of glass or the addition of glass but instead alters the composition of the glass by replacing existing mobile alkali ions in the glass with other alkali ions (e.g., $Na^+$ replaced by $K^+$) from an outside source, such as a molten bath. Likewise, laser writing does not remove any glass from body 11 or add glass thereto, but instead locally alters the structure of the glass by locally compacting it, which in turn locally increases the refractive index.

The depth dC to which waveguides 61 reside relative to top surface 12 or bottom surface 14 of glass substrate 10 can vary (see close-up inset of FIG. 2A). Likewise, the pitch p of waveguide array 60 can vary with position and in particular can vary in the y-direction as well as in the z-direction in the case where body 11 supports different rows of waveguides 61 at different depths within body 11. Each waveguide 61 can include a tapered section and can also vary in size along its length. The path of each waveguide 61 can also vary, i.e., it need not run in a straight line and as noted above need not run in a given x-y plane. The waveguides 61 can be single mode or multimode. In an example, the back ends 64 of waveguides 61 define respective optical quality end faces, which in an example can be formed by polishing (e.g., laser polishing or mechanical polishing) or score and break (e.g. diamond wheel scoring or laser scoring).

The glass waveguide assembly 50 also includes at least one waveguide termination member ("connector") 80 that terminates at least one waveguide 61, e.g., at or adjacent back end 64 at connector region(s) 15. In an example, a single connector 80 terminates multiple waveguides 61, i.e., is a multi-waveguide connector. In an example, connector 80 is configured as an MT type or MPO type connector. In an example, each connector 80 terminates a corresponding array 60 of one or more waveguides 61. In another example, at least one connector 80 includes waveguides 61 from different waveguide arrays 60. Different configurations for connector 80 are described below. In an example, connector 80 encloses the back-end section 60S of waveguide array 60 at connector region 15.

The glass waveguide assembly 50 can includes one or more different types of optical features or components 100, such as waveguide splitters, tapers, pitch converters, optical couplers, circulators, curves, bends, and light-redirecting elements.

The glass waveguide assembly 50 can also include one or more OE-PCB features or components 110 to facilitate the use of the glass waveguide assembly in forming an OE-PCB, as described below. Example OE-PCB features or components 110 include conducting (e.g., metal-filled) vias, insulating (e.g., polymer-filled) vias, electrical (conducting) contacts, electrical (conducting) wiring, optical vias, slots, cut-outs, polymer-filled cut-outs, open holes, perforations, fiducials, alignment features, etc. In an example, the OE-PCB features 110 are formed by drilling, etching, milling, depositing, etc. In particular, cut-outs are relatively large sections removed from glass substrate 10 and that can be used for mounting glass waveguide assembly 50 to a PCB or OE-PCB. The cut-outs can be filled with a non-glass material (e.g., a polymer), some or all of which can be removed later on in the OE-PCB fabrication process. The OE-PCB features or components 110 for alignment are formed where needed to allow for a simple passive alignment process for connectors 80 and for other photonic devices of the OE-PCB.

With reference now to FIG. 2B, the glass waveguide assembly 50 includes a protective coating 150 that has an outer surface 152. The protective coating 150 covers at least a substantial portion of top surface 12 of glass substrate 10. In an example, protective coating 150 covers substantially the entire top surface 12. Also in an example, protective coating 150 covers at least a portion of bottom surface 14. Further in the example, protective coating 150 also covers at least a portion of sides 26. In an example, protective coating 150 is applied to the entire glass substrate 10 except optionally for select regions (e.g., one or more connector regions 15) so that the glass substrate is substantially encapsulated. Thus, protective coating 150 may or may not include the one or more connector regions 15. In another example, protective coating 150 runs the length in the y-direction of top surface 12 except for the one or more connector regions 15 and further in the example does not extend to sides 26. In an example, protective coating 150 is selectively applied to some or all of the OE-PCB features or components 110 of glass waveguide assembly 50. In an example, protective coating 150 is applied to the same portion of top surface 12 of glass substrate 10 below which or at which waveguide array 60 is supported.

In an example, protective coating 150 is a dielectric material compatible with conventional PCB processing. An example material for protective coating 150 is a polymer or a resin. When connectors 80 are formed prior to applying protective coating 150, the connector regions 15 can be left uncoated, e.g., by using a masking process or a selective deposition or coating process or lift-off process. In other examples, connectors 80 include a portion of protective coating 150 as formed on connector regions 15.

One function of protective coating 150 is to protect glass substrate 10 and the other OE-PCB features or components 110 of glass waveguide assembly 50 during subsequent PCB processing, which can involve relatively high temperatures. A related function of protective coating is to facilitate the use of PCB processing techniques forming the glass waveguide assembly 50 as well as for forming an OE-PCB as described below. Thus, in an example, protective coating 150 is made of a thermally stable material, including such materials that are optically transparent. In an example, protective coating 150 has a thickness TH2 in the range from 1 μm to 200 μm (see FIG. 3A, introduced and discussed below). Thus, in an example, glass waveguide assembly 50 has a thickness TH3=TH1+2(TH2) when top and bottom surfaces 12 and 14 of glass substrate 10 are coated or has a thickness TH3=TH1+TH2 when only the top surface of the glass substrate is coated.

Not all of the OE-PCB features or components 110 of glass waveguide assembly 50 need to be encapsulated within the protective coating 150. Thus, in an example, some of the OE-PCB features or components 110 (e.g., vias) can extend through protective coating 150. Likewise, connectors 80 as well as some of the optical features or components 100 and the OE-PCB features or components 110 can also extend from or otherwise not be coated with protective coating 150. In an example, OE-PCB features or components 110 in the form of electrical wiring can be formed on outer surface 152 of protective coating 150, as shown in FIG. 2B. Some of the OE-PCB features or components 110 can be formed during PCB processing, i.e., using PCB processing techniques, in connection with forming an OE-PCB, as explained below.

The outer shape of glass sheet 10 can have any reasonable form so that the resulting glass waveguide assembly 50 can also have any reasonable form. In an example, the shape and dimensions (e.g., LX, LY and TH1) of glass waveguide assembly 50 can be made to comport with standard PCB processing, e.g., have the same dimensions of standard PCB sheets. In an example, multiple glass waveguide assemblies 50 can share a single protective coating 150.

Figure 2C:
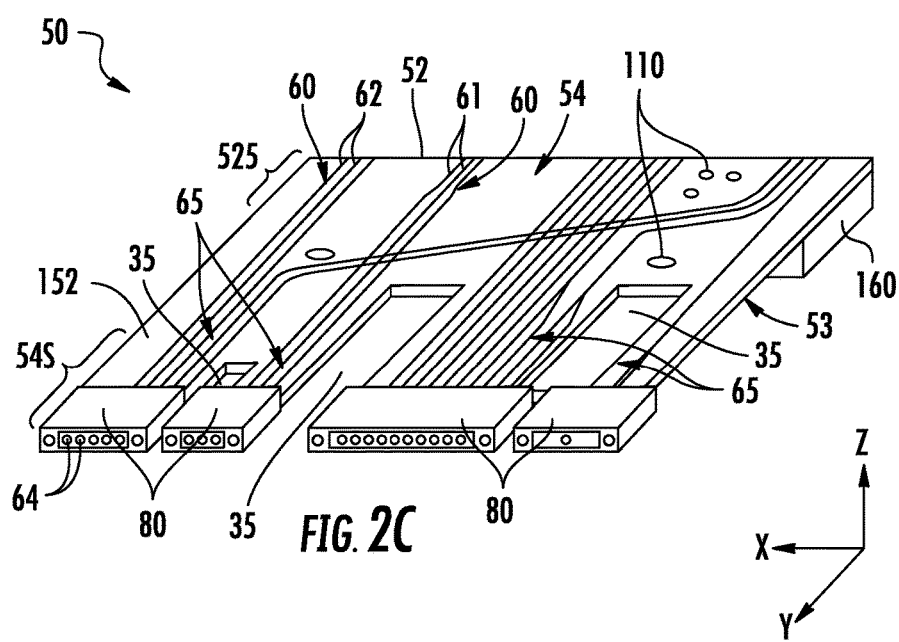
FIG. 2C is similar to FIG. 2B and shows an example embodiment of the glass waveguide assembly that includes slots that define independently flexible and connectorized waveguide sections.

FIG. 2C is similar to FIG. 2B and shows an elevated back-end view of an example glass waveguide assembly 50 that includes a base section 160 added to bottom side 53 adjacent back end 54 at the back-end section 54S. The base section 160 provides rigidity to the back-end section 54S of glass waveguide assembly 50 for mounting purposes, for example. The example glass waveguide assembly 50 of FIG. 2C also shows an embodiment wherein slots 35 are cut out of back end 24 of glass substrate 10 to create two or more independently flexible waveguide sections 65 that include one or more respective waveguides 61. Each of the waveguide section may comprise a suitable number of glass optical waveguides as desired and may be independently flexible for routing, optical connecting or connectorization of an end. For instance, one or more of the waveguides of each waveguide section being terminated by a corresponding connector 80 (i.e., "connectorized"). Slots 35 can also be formed in front end 22 of glass substrate 10 to define flexible waveguide sections 65 in front-end section 52S. In another example discussed below (see FIGS. 11A, 11B), waveguides 61 can be connectorized at front end 52 of the glass waveguide assembly 50 using a single connector 80 or multiple connectors 80.

FIGS. 3A through 3L are x-z cross-sectional views of glass waveguide assembly 50 illustrating different configurations for an example array 60 of waveguides 61, wherein the cross-sections can be considered as taken either at front-end section 52S or back-end section 54S. The x-z cross-sectional views can be considered as taken over the entire width of glass waveguide assembly 50 or over one of the flexible waveguide sections 65. The horizontal pitch p and the vertical pitch p' of the waveguide arrays can be that used in standard optical fiber connectors, e.g., 125 microns or 250 microns.

FIG. 3A illustrates a first example configuration for the waveguide array 60 of the glass waveguide assembly 50. The thickness TH1 of glass substrate 10 can be between 20 microns and 50 microns, with the waveguide array being located closer to the top surface 12 than the bottom surface 14 of body 11 of the glass substrate. The protective coating 150 covers top surface 12, bottom surface 14 and sides 26.

FIG. 3B illustrates a second example configuration for waveguide array 60 of the glass waveguide assembly 50. The example glass substrate 10 can have a thickness TH1 between 50 microns and 500 microns. The protective coating 150 covers top surface 12, bottom surface 14 and sides 26.

FIG. 3C illustrates a third example configuration for waveguide array 60 of the glass waveguide assembly 50. The glass substrate 10 can have a thickness TH1 in the range from 50 microns to 300 microns. The glass substrate 20 supports upper and lower waveguide arrays 60A and 60B respectively located adjacent top surface 12 and bottom surface 14 of glass substrate 10. The protective coating 150 covers top surface 12, bottom surface 14 and sides 26. The waveguide arrays 60A and 60B are shown as having the same horizontal pitch p. The vertical pitch p' need not be the same as the horizontal pitch p.

FIG. 3D illustrates a fourth example configuration for waveguide array 60 of the glass waveguide assembly 50. The glass substrate 10 has a laminated structure formed by two glass sheets 10A and 10B bonded by a bonding layer 17. The upper glass sheet 10A supports a first waveguide array 60A while the lower glass sheet 10B supports a second waveguide array 60B. The horizontal and vertical pitches p and p' of the waveguide array can be that used in standard optical fiber connectors, e.g., 125 microns or 250 microns. The protective coating 150 covers both the top and bottom glass sheet 10A and 10B.

FIG. 3E illustrates a fifth example configuration for waveguide array 60 of the glass waveguide assembly 50. The glass substrate 10 has a laminated structure formed by three glass sheets 10A, 10M and 10B bonding by respective bonding layers 17, with the glass sheet 10M being sandwiched in the middle. The upper glass sheet 10A supports a first waveguide array 60A while the lower glass sheet 10B supports a second waveguide array 60B. The protective coating 150 surrounds the entire structure.

FIG. 3F illustrates a sixth example configuration for waveguide array 60 of the glass waveguide assembly 50. The glass substrate 10 has a laminated structure formed by two glass sheets 10A and 10B that sandwich an intervening portion of protective coating 150. The upper glass sheet 10A supports a first waveguide array 60A while the lower glass sheet 10B supports a second waveguide array 60B. The protective coating 150 also covers both the top and bottom glass sheet 10A and 10B.

Figure 3G:
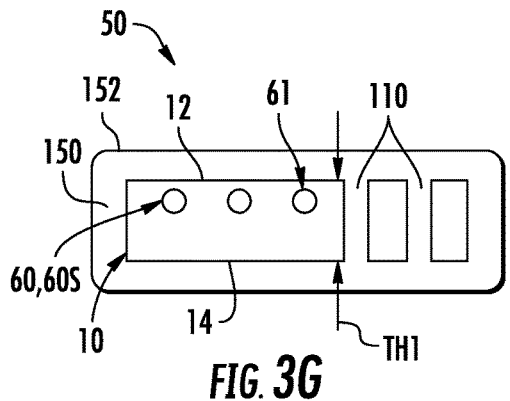

FIG. 3G illustrates a seventh example configuration for waveguide array 60 of the glass waveguide assembly 50. The glass waveguide assembly includes a waveguide array 60 along with OE-PCB features or components 110 in the form of holes that run between the top and bottom surfaces 12 and 14 of the glass substrate 10. In an example, holes 110 are filled with the same material that makes up the protective coating 150, e.g., a polymer material suitable for use in PCB processing. Another PCB-compatible material can also be used. The filled holes 110 allow for high-throughput drilling and metal plating to be performed with standard PCB process equipment. The protective coating 150 covers glass sheet 10.

Figure 3H:
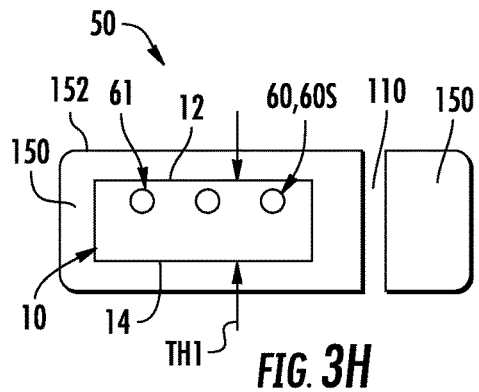

FIG. 3H illustrates an eighth example configuration for waveguide array 60 of the glass waveguide assembly 50 similar to that shown in FIG. 3G. The glass waveguide assembly 50 now includes an OE-PCB feature or component 110 in the form of a through hole, which can be formed by drilling through one of the filled holes 110 of FIG. 3G. The through-hole 110 can be used to mount the glass waveguide assembly 50 onto a PCB or like substrate when forming an OE-PCB. A cut-out feature 110 can be formed in a similar fashion. The protective coating 150 covers both the top and bottom glass sheet 10A and 10B but does not cover or fill the through-hole 110.

Figure 3I:
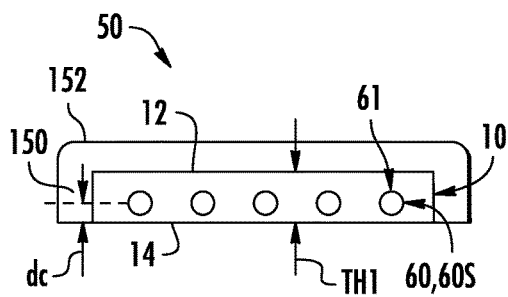

FIG. 3I illustrates a ninth example configuration for waveguide array 60 of the glass waveguide assembly 50. The waveguide array 60 is located closest to the bottom surface 14 of glass substrate 10. There is no coating layer 150 on bottom surface 14 so that waveguides 61 can be in close optical communication (e.g., adiabatic coupling) with other waveguides, e.g., from a photonic integrated circuit (PIC) of the OE-PCB, as discussed below. The maximum (core) refractive index of waveguides 61 can reside at a depth dC of a few microns (e.g., between 3 microns and 10 microns) from the bottom surface 14 of glass substrate 10.

Figure 3J:
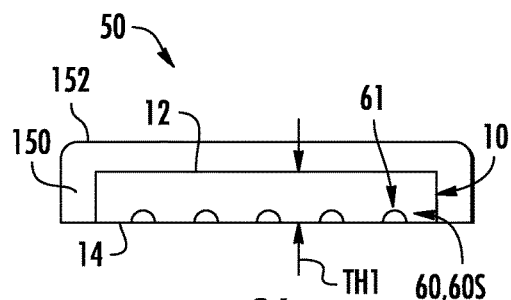

FIG. 3J illustrates a tenth example configuration for waveguide array 60 of the glass waveguide assembly 50 similar to that of FIG. 3H, but with the maximum (core) refractive index of waveguides 61 located at the bottom surface 14 of glass substrate 10, i.e., dC=0. There is no coating layer 150 on bottom surface 14 so that waveguides 61 can be in close optical communication (e.g., adiabatic coupling) with other waveguides, e.g., from other devices (e.g., a PLC).

Figure 3K:
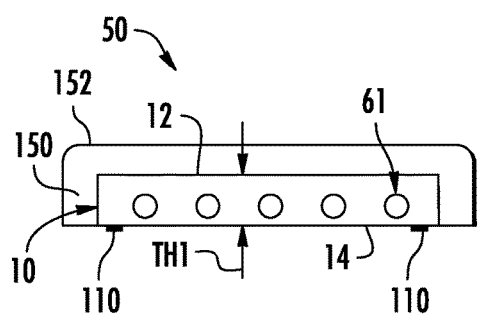

FIG. 3K illustrates an eleventh example configuration for waveguide array 60 of the glass waveguide assembly 50 similar to FIG. 3H but also including OE-PCB features or components 110 in the form of fiducials or alignment marks to facilitate alignment of waveguides 61 with other waveguides, such as from a PIC of an OE-PCB.

Figure 3L:
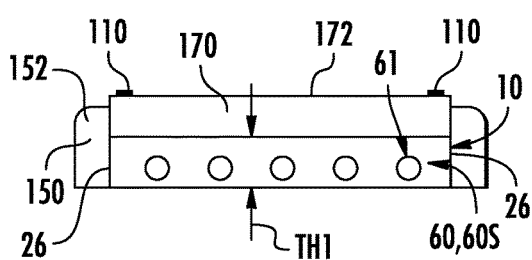

FIG. 3L illustrates a twelfth example configuration for waveguide array 60 of the glass waveguide assembly 50 similar to FIG. 3K but that includes cover member 170 disposed on top surface 12 of glass substrate 10 in place of protective coating 150. The cover member 170 has a top surface 172 that in an example supports OE-PCB features 110 in the form of alignment fiducials. Note that protective coating 150 is shown covering only sides 26 of glass substrate 10 at this particular location where the cross-sectional view is taken.

Figure 4A:
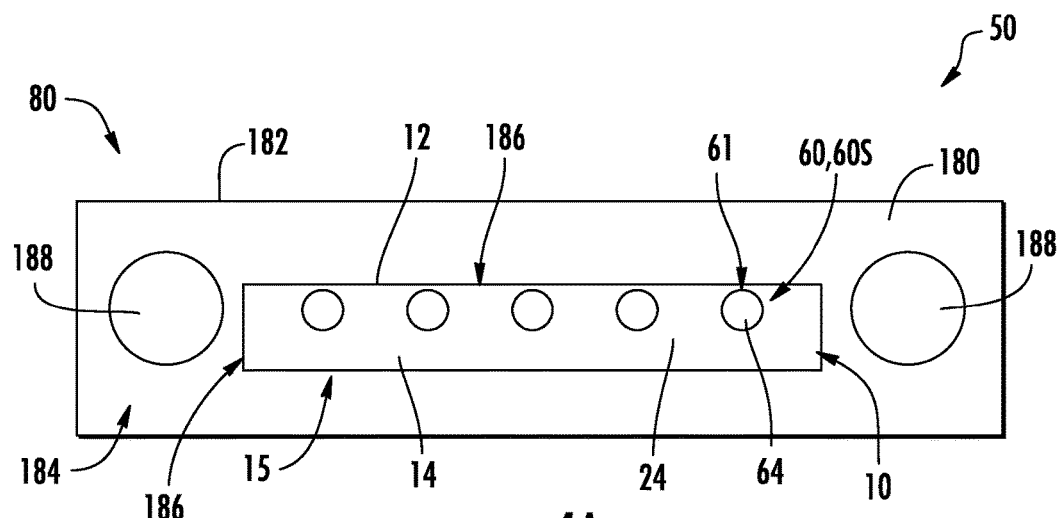
FIGS. 4A and 4B are end-on views of an example connector of the glass waveguide assembly.
Figure 4B:
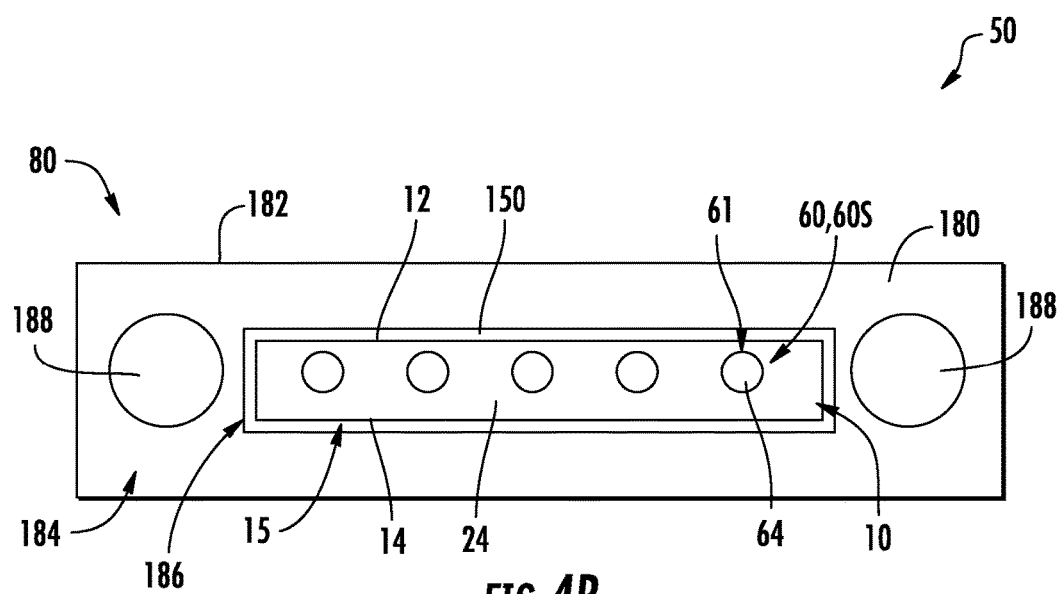

FIG. 4A is an end-on view of an example connector 80 of glass waveguide assembly 50, wherein the connector has an MT type configuration. In the example of FIG. 4A, connector region 15 does not include coating layer 150 and instead is immediately surrounded by a connector housing 180. In another embodiment, coating layer 150 covers at least a portion of connector region 15 and so is included in connector 80, as shown in FIG. 4B. The connector housing 180 includes a top surface 182, an end face 184 and an interior 186. The end face 184 includes one or more alignment features 188, e.g., alignment holes as shown, or alignment pins. The connector region 15 of glass waveguide assembly 50 resides within interior 186. In an example, connector housing 180 comprises a ferrule, e.g., an MT ferrule or MPO ferrule. In an example, connector 80 has dimensions of a standard MT connector for the given number of waveguides 61 within the connector.

Figure 4C:
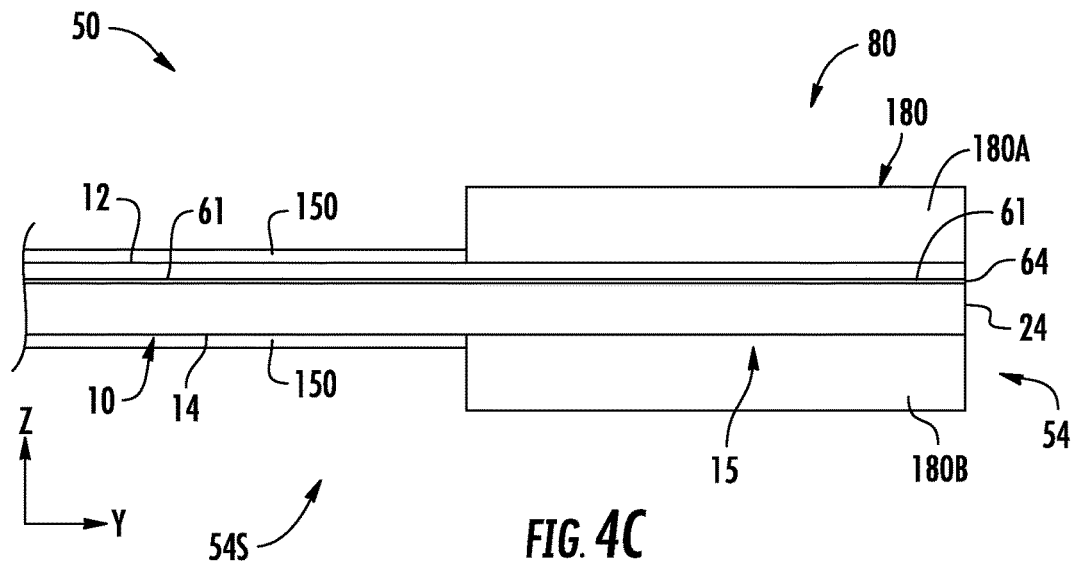
FIGS. 4C and 4D are y-z cross-sectional views of two example connectors illustrating how the connector housing interfaces with the back end of the glass substrate.
Figure 4D:
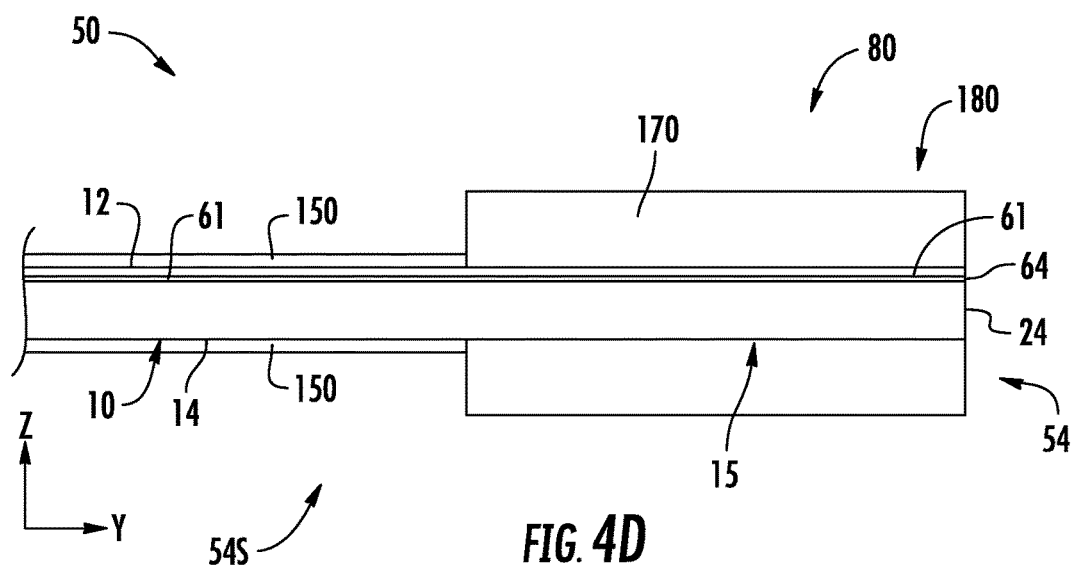

FIGS. 4C and 4D are y-z cross-sectional views of two example connectors 80 illustrating how connector housing 180 interfaces with back end 24 of glass substrate 10. In an example, connector housing 180 can include top and bottom sections 180A and 180B that respectively reside adjacent top surface 12 and bottom surface 14 of glass substrate 10. FIG. 4C shows an example of a cover member 170 used along with or as part of connector housing 180.

Figure 4E:
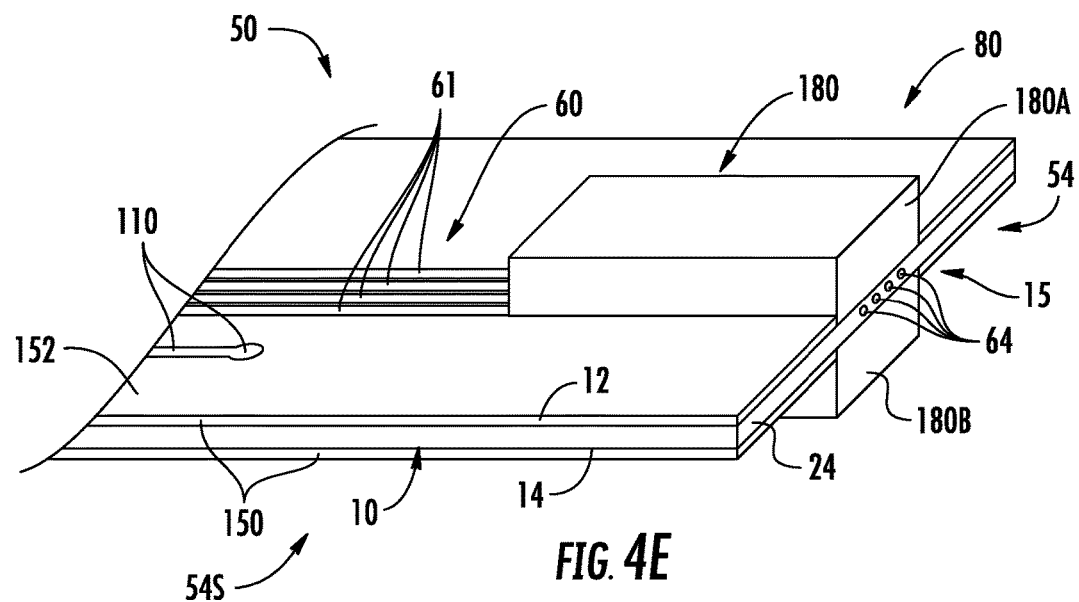
FIGS. 4E and 4F are elevated views of two example connectors at the back-end section of the glass waveguide assembly showing two example connector configurations.
Figure 4F:
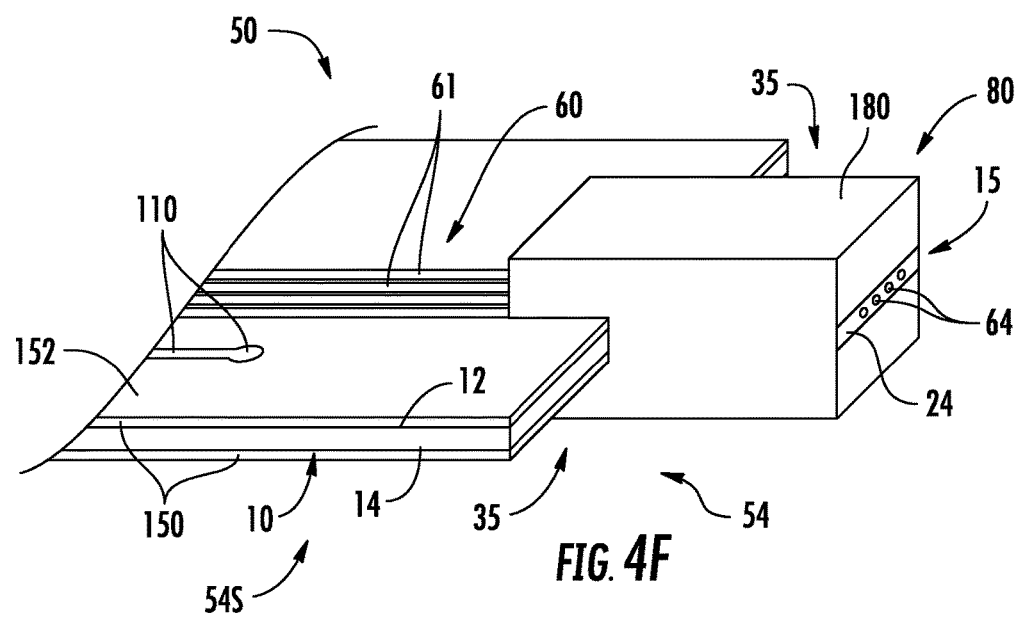

FIGS. 4E and 4F are elevated views of two example connectors 80 at the back-end section 54S of glass waveguide assembly 50 showing two example connector configurations. The embodiment of FIG. 4E shows an example where back end 54 of glass waveguide assembly 54 is even all the way across and wherein the connector housing 180 comprises top and bottom housing sections 180A and 180B. The embodiment of FIG. 4E shows an example where back end 54 of glass waveguide assembly 50 includes slots 35 or recesses on either side of connector region 15 so that a portion of connector 80 extends beyond the back end 54 as defined by the non-connector portions of back-end section 52S. Also shown in FIGS. 4E and 4F are an example OE-PCB features or components 110 in the form of a metal wire and a contact pad on outer surface 152 of protective coating 152.

Figure 5A:
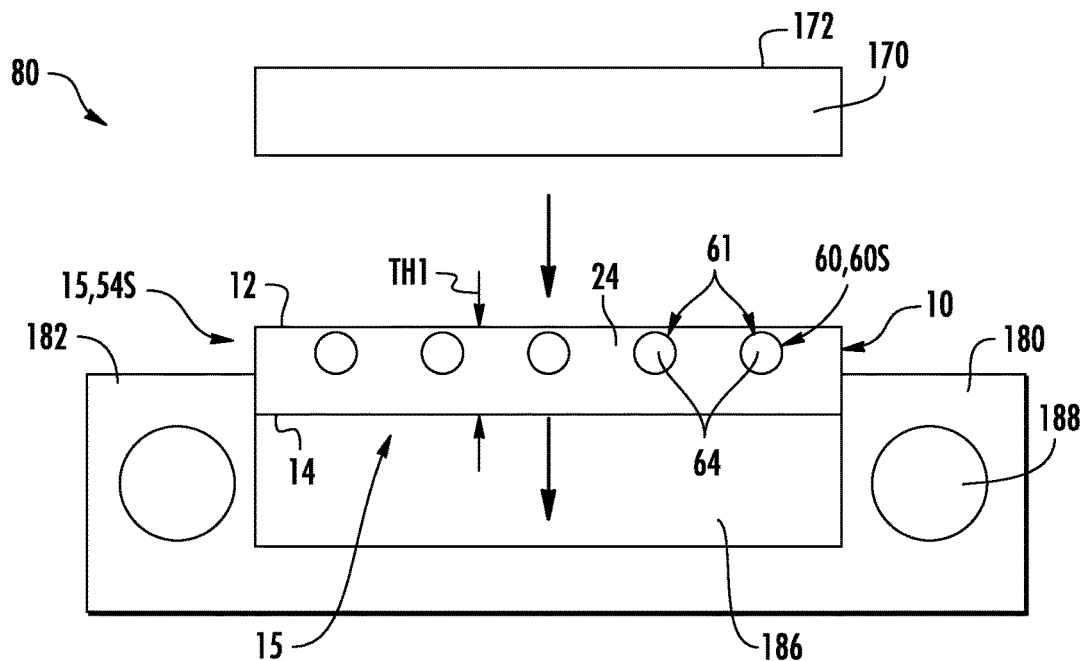
FIGS. 5A and 5B are end-on views of an example glass waveguide assembly that illustrate an example of how the connector is formed.
Figure 5B:
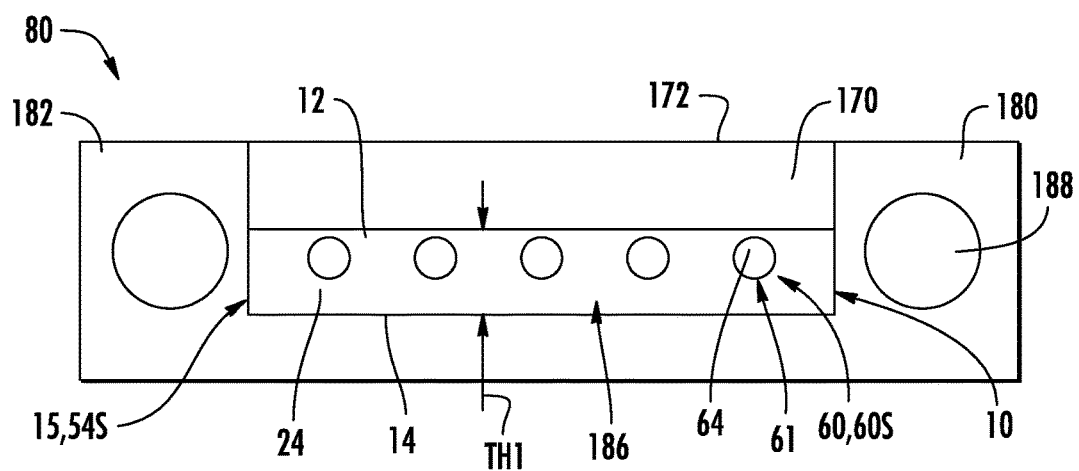

FIGS. 5A and 5B are end-on views of an example connector 80 illustrating one method of forming the connector. FIG. 5A is a partially exploded view that shows connector region 15 of back-end section 54S of glass waveguide assembly 50 being inserted into a U-shaped interior section 186 of connector housing 180. The end portion of the glass waveguide assembly 50 has a configuration similar to that shown in FIG. 3L but with the coating layer 150 removed. A cover member 170 is disposed on top surface 12 of glass substrate 10 in the back-end section 54S. In an example, cover member 170 is a MT cover or "lid" that is used with a connector housing 180 defined by an MT ferrule.

FIG. 5B shows connector region 15 of back-end section 54S of glass waveguide assembly 50 residing within interior section 186 of connector housing 180 to form connector 80. In the example shown, cover member 170 is sized so that it is flush with top surface 182 of connector housing 180. Thus, in an example, where the thickness TH1 of glass sheet 10 is such that it does not fill interior section 186 of connector housing 180, cover member 170 can be used to fill in the extra interior space.

FIG. 6A through 6C are back-end elevated views of back-end section 54S of glass waveguide assembly 50 and illustrate an example of how the glass waveguide assembly can be connectorized and incorporated into a PCB structure to form an OE-PCB. FIG. 6A shows the embodiment similar to FIG. 3L that includes cover member 170 on top surface 12 of glass substrate 10, wherein the top surface is covered with protective coating 150 except for connector region 15.

FIG. 6B shows a PCB 200 having a laminated structure made up of conductive layers 202 and insulating layers 210. Conductive vias 220 through the insulating layers 210 electrically connect the conductive layers 202 to one another. The conductive layers 202 include conductive wires 204. The conductive layers 202 can be formed from copper while the insulating layers 210 can be formed from a polymer. The front-end section 52S of glass waveguide array 50 is inserted into an aperture 230 in the PCB 200 so that connector region 15 of back-end section 54S of glass waveguide assembly 50 extends from the side of the PCB. The connector housing 180 is then added to connector region 15 of back-end section 54S of glass waveguide assembly to form connector 80. The front-end section 52S of glass waveguide assembly 50 includes the aforementioned optical features or components 100 (see FIG. 2A) as well as the OE-PCB features or components 110, and is configured to operably engage corresponding optical components within the PCB so that connector 80 provides optical communication to the OE-PCB via waveguides 61. Any remaining space with interior section 186 of connector housing 180 can be filled, e.g., with an adhesive or other filler material such as a polymer.

Figure 7A:
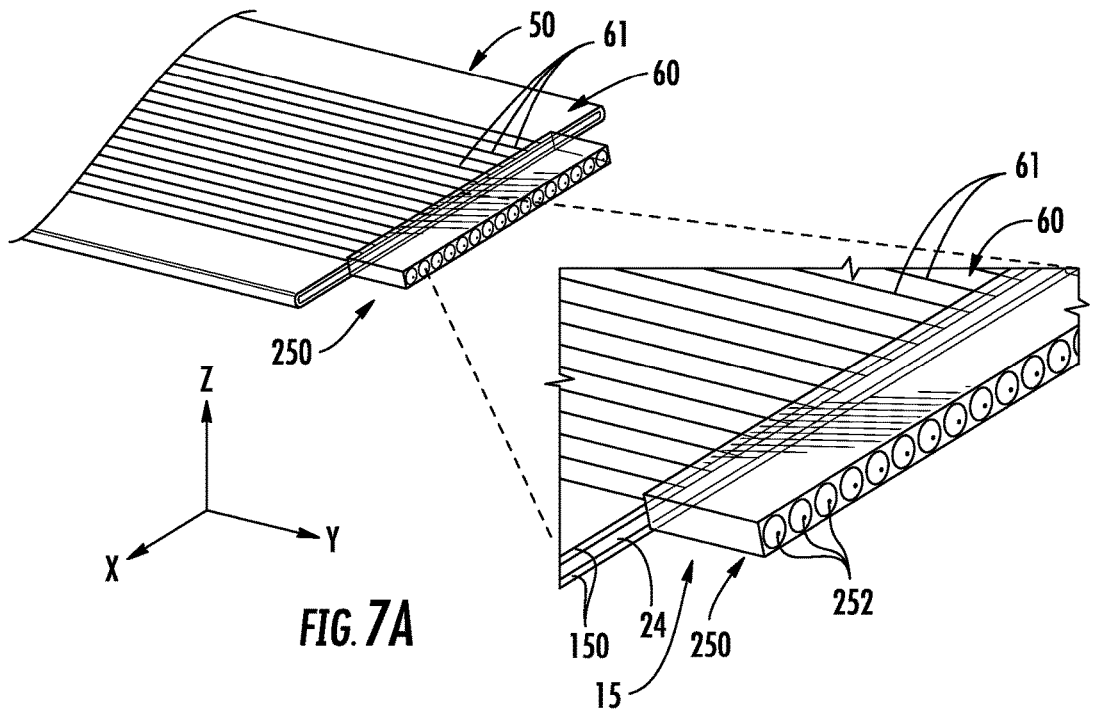
FIG. 7A is an elevated view of the back-end portion of the glass waveguide assembly illustrating an embodiment that includes a microlens array.
Figure 7B:
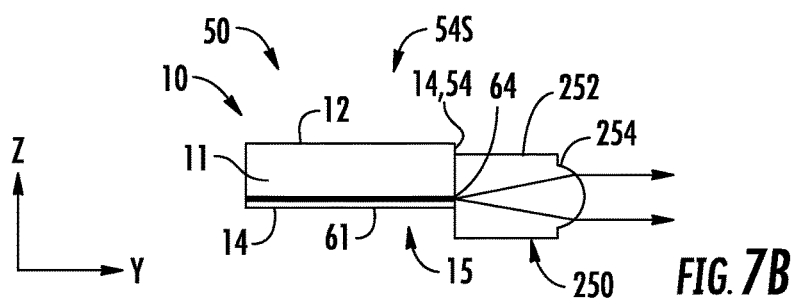
FIGS. 7B and 7C are close-up y-z cross-sectional views of the back-end portion of the glass waveguide assembly showing example types of microlens elements.
Figure 7C:
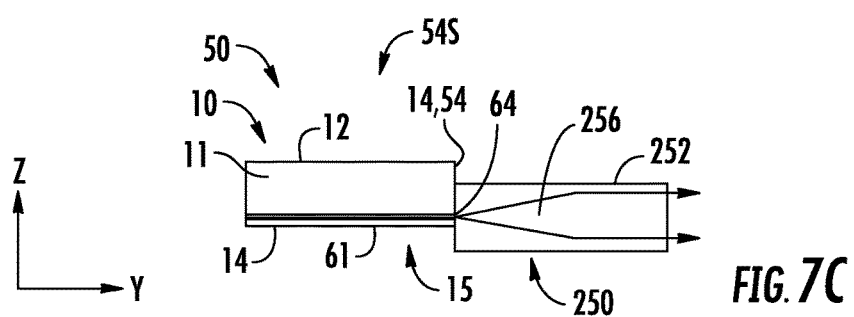

FIG. 7A is an elevated view of back-end section 54S of glass waveguide assembly 50 illustrating an embodiment wherein a microlens array 250 of microlens elements 252 is operably disposed adjacent back end 54 at connector region 15 of the glass waveguide assembly 50. The back end 64 of each waveguide 61 aligns with a corresponding microlens element 250. FIG. 7B is a close-up y-z cross-sectional view of back-end section 54S of the glass waveguide assembly 50 at connector region 15 showing an example microlens element 252 aligned with a waveguide 61. The microlens element 252 can be a conventional refractive element having a curved surface 254 or a gradient refractive index 256 to define a GRIN lens element, such as shown in FIG. 7C. In an example, GRIN lens elements 252 can be formed using multimode fiber stubs.

FIG. 8 is an elevated view of a connectorized glass waveguide assembly 50 wherein connector 80 operably supports microlens array 250 relative to waveguides 61. The alignment features 188 are shown in the form of alignment pins. FIG. 8 also shows a multi-fiber connector 280 in position to operably engage with connector 80 of glass waveguide assembly 50. The multi-fiber connector 280 can be an expanded-beam connector, such as the MXC® connector platform, available from U.S. Conec, Ltd., Hickory, N.C.

Example OE-PCB Configurations

Figure 9:
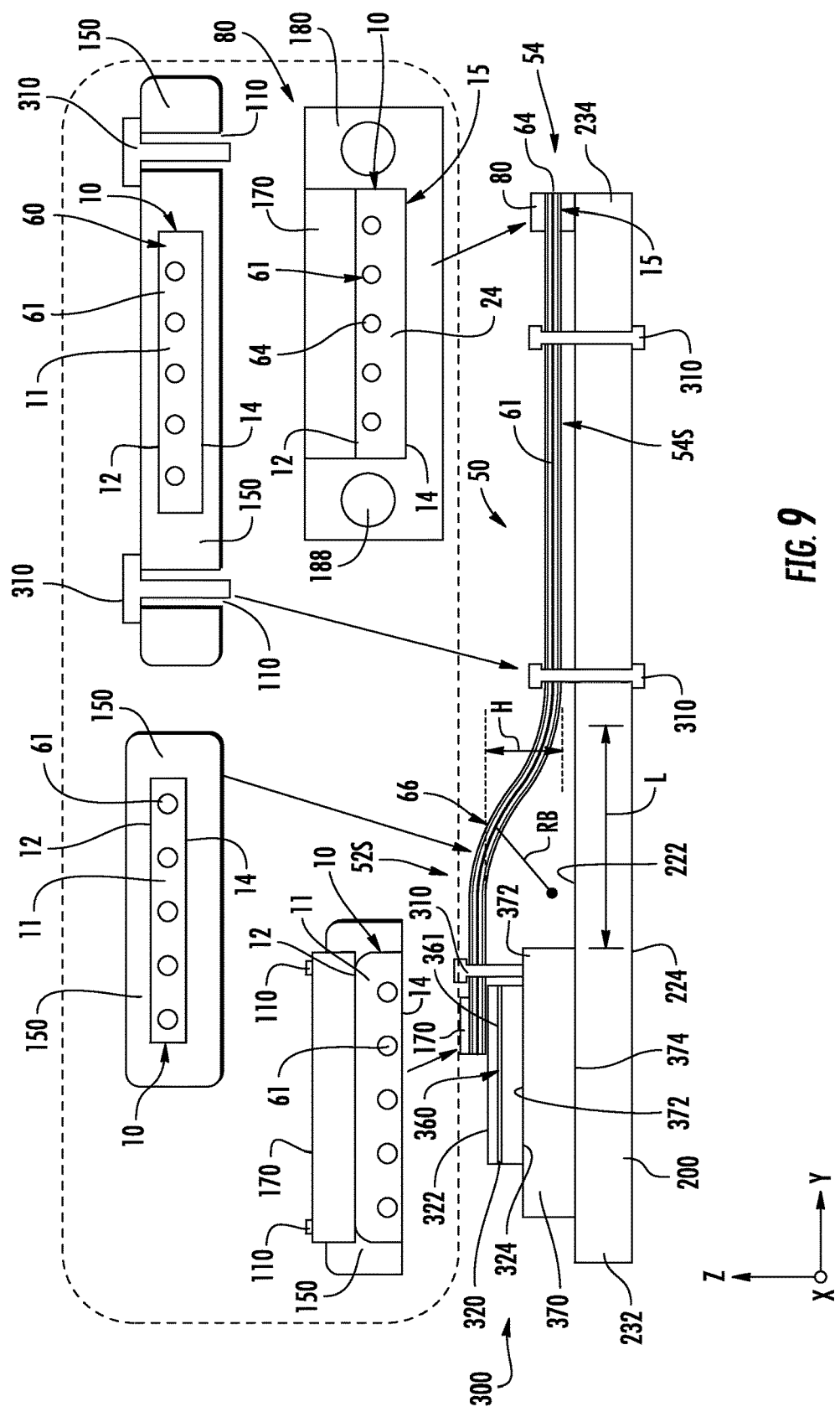
FIG. 9 is a side view of an example OE-PCB that employs the glass waveguide assembly in a fly-over configuration.

Numerous constructions and applications are possible using the concepts disclosed herein. FIG. 9 is a side view of an example OE-PCB 300 that includes the glass waveguide assembly 50 as disclosed herein. FIG. 9 includes a number of close-up insets of cross-sectional views taken at different x-z planes at different y-positions along glass waveguide assembly 50. The OE-PCB 300 also includes PCB 200 having a top surface 222, a bottom surface 224, a front end 232 and a back end 234. The OE-PCB 300 further includes a PIC 320 adjacent the PCB front end 232 and operably supported by an interposer 370 that resides between the PIC and PCB 200. Thus, the PCB operably supports the PIC. The interposer 370 has a top surface 372, a bottom surface 374 and is configured to facilitate either electrical or electrical and optical connections between PIC 320 and PCB 200. The PIC 320 has a top surface 322, a bottom surface 324, and includes an array 360 of waveguides ("PIC waveguides") 361 that in an example reside at or adjacent the PIC top surface. In an example, PIC 320 also includes at least one other photonic device 326 besides PIC waveguides 361, such as a detector or a light emitter (see FIG. 10B). As noted above, PIC 320 can comprise a PLC.

The PIC 320 can be operably supported by interposer 370 in a flip-chip configuration, with top surface 322 facing top surface 372 of the interposer. The OE-PCB 300 illustrates an example of how glass waveguide assembly 50 can be used in a fly-over configuration with PCB 200.

The glass waveguide assembly 50 is operably supported in OE-PCB 300 by support members 310 that pass through OE-PCB features or components 110 in the form of through-holes. The connector 80 resides at or adjacent PCB back end 234 and the front-end section 52S of glass waveguide assembly 50 resides adjacent PIC top surface 322. The waveguides 61 are thus in optical communication with (e.g., are evanescently coupled to) PIC waveguides 361 of PIC 320.

The front-end section 52S of glass waveguide assembly 50 has a bend section 66 that in an example is defined by a length L and a height H. The bend section 66 has a bend radius RB, which in an example is in the range from 5 mm to 30 mm. In an example, bend section 66 is formed in a manner that causes front-end section 52S and the back-end section 54S to reside parallel planes that are spaced apart in the z-direction by the height H.

The waveguide loss increases by bending waveguides 61. For multimode waveguides 61, additional bend loss can be reduced down to a bend radius RB of 15 mm. For ion-exchanged single-mode waveguides 61, the bend loss minimum of very low index delta waveguides 61 with delta n of 0.003 is 30 mm. Based on these assumptions, the relation between the height H and length L for the bend section 66 formed in front-end section 52S is calculated in Table 1 below. The results show the feasibility of the design and use of glass waveguide assembly 50 having a bend. The maximum length L is 21.5 mm in the case where the height H is 4 mm, which in an example is a maximum value for height H due to OE-PCB packaging limitations.

TABLE 1

Example bend section parameters

| RB | H = 1 mm | H = 2 mm | H = 3 mm | H = 4 mm |
|---|---|---|---|---|
| 15 mm | L = 7.7 mm | L = 10.8 mm | L = 13.1 mm | L = 15.0 mm |
| 30 mm | L = 10.9 mm | L = 15.4 mm | L = 18.7 mm | L = 21.5 mm |

FIG. 10A is similar to FIG. 9 and shows how front-end section 52S of glass waveguide assembly 50 can be manipulated into different positions P1, P2 and P3 during the fabrication process for OE-PCB 300. During the OE-PCB fabrication, back-end section 54S of glass waveguide assembly 50 is secured between insulating layers 210 of PCB 200 while front-end section 54S resides in an initial storage position P1 within a recess 223 in the top surface 222 of the PCB. During assembly of OE-PCB 300 when interposer 370 and PIC 320 are added to the structure, front-end section 52S of glass waveguide assembly 50 is flexed backwards and out of the way into an intermediate position P2. Once interposer 370 and PIC 320 are operably arranged, then front-end section 52S is operably disposed on top surface 322 of PIC 320 at final position P3 to establish optical communication (e.g., adiabatic coupling) between waveguides 61 and PIC waveguides 361.

FIG. 10B is similar to FIG. 10A and illustrates an example embodiment of OE-PCB 300 wherein glass waveguide assembly 50 is embedded as a layer within PCB 200. The front ends 62 waveguides 61 terminate at a corresponding optical vias 380 that runs in the z-direction through interposer 370 and to bottom surface 224 of PIC 320. Each optical via 380 has a top end 382 and a bottom end 384. In an example, the optical via 380 includes a light-turning structure 390 adjacent bottom end 384 that defines an optical path from the front end 62 of waveguide 61 through optical via 380 and to bottom surface 324 of PIC 320. In an example, the top end 382 of optical via 380 resides adjacent or in contact with a photonic device 326 disposed at bottom surface 324 of PIC 320 and within optical via 180 to establish an optical path between waveguide 61 and the photonic device. In an example, the light-turning structure 390 includes a total-internal reflection (TIR) surface. The connectors 80 at the back-end section 54S of glass waveguide assembly 50 reside at or adjacent back end 234 of PCB 200.

Figure 10C:
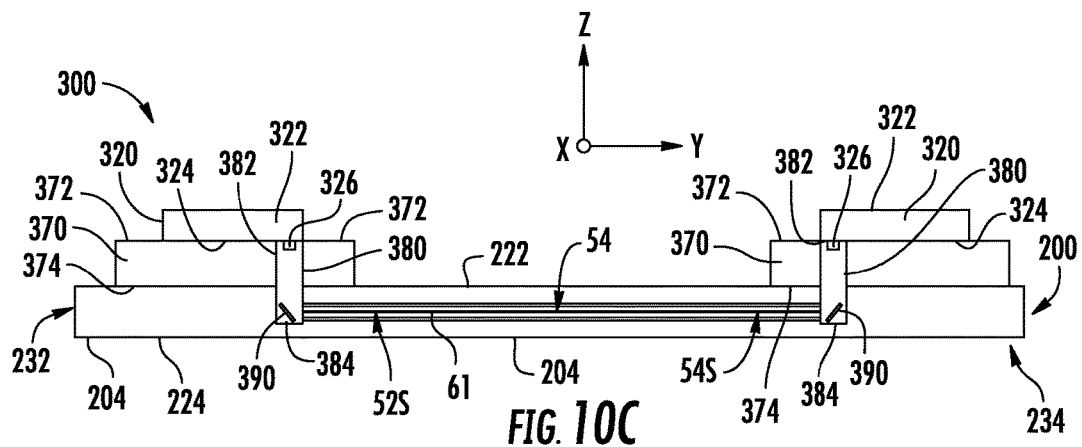
FIG. 10C is similar to FIG. 10B and shows an example OE-PCB wherein first and second PICs are in optical communication through the glass optical waveguides of the glass waveguide assembly embedded in the PCB.

FIG. 10C is similar to FIG. 10B and shows an example embodiment of OE-PCB 300 that includes a second PIC 320 supported by a second interposer 370 adjacent back end 234 of PCB 200. Instead of having connectors 80, back ends 64 of waveguides 61 terminate at a second optical via 380 that runs in the z-direction through second interposer 370 and to bottom surface 224 of second PIC 320. Thus, the two PICS 220 are in optical communication through the two optical vias 380 and waveguides 61 of glass waveguide assembly 50, which is incorporated into the laminated structure of PCB 200.

Figure 10D:
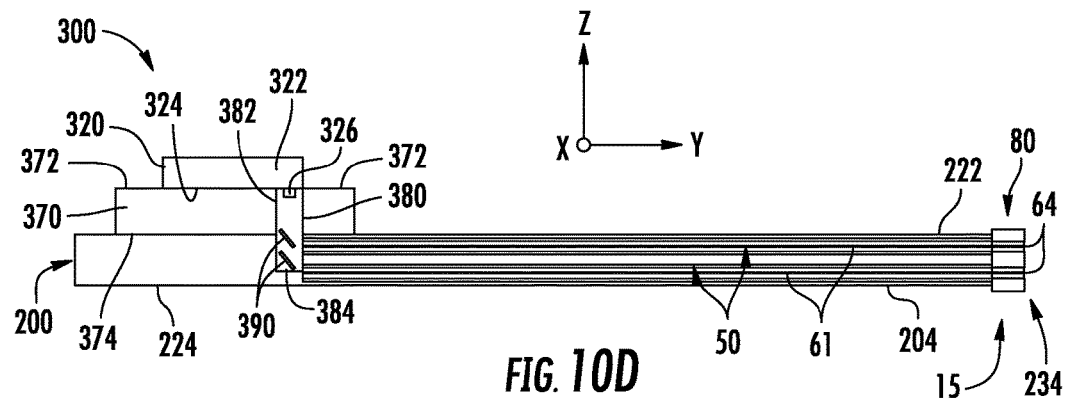
FIG. 10D is similar to FIG. 10B and shows two glass waveguide assemblies embedded in the PCB.

FIG. 10D is similar to FIG. 10B and shows an example embodiment of the OE-PCB 300 that includes first and second glass waveguide assemblies 50 supported as different layers within PCB 200. The front ends 62 of waveguides 61 of the two glass waveguide assemblies 50 terminate at a common optical via 380, which includes two light-turning structures 390 respectively aligned with the two waveguides 61 at the waveguide front ends 62. In another example, the front ends 62 of waveguides 61 can terminate at different optical vias 380 that lead to different photonic devices 326.

Figure 11A:
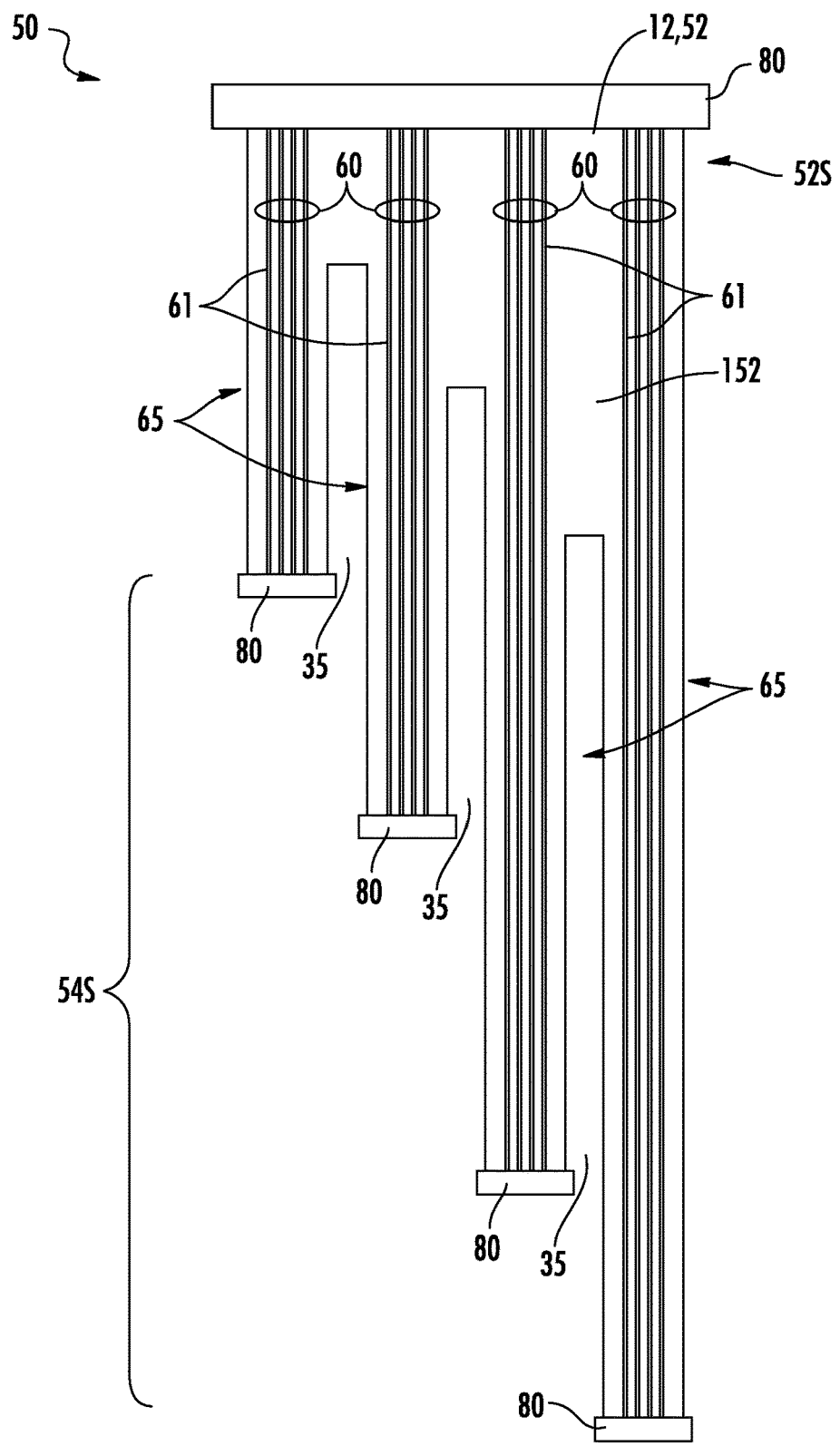
FIGS. 11A and 11B are top-down views of example glass waveguide assemblies similar to that shown in FIG. 2C and that include four connectorized waveguide sections each supporting four glass optical waveguides and also showing a connectorized front end.

FIG. 11A is a top-down view of an example glass waveguide assembly 50 that includes four waveguide sections 65 defined by three slots 35 formed in back-end section 54S. Each of the four waveguide sections 65 is respectively terminated by a back-end connector 80 while the front end 52 of the glass waveguide assembly 50 is terminated by single front-end connector 80. In an example, waveguides 61 can be routed so that they are evenly spaced and have a select horizontal pitch p at the front-end connector 80, such as shown in FIG. 11B.

Figure 11B:
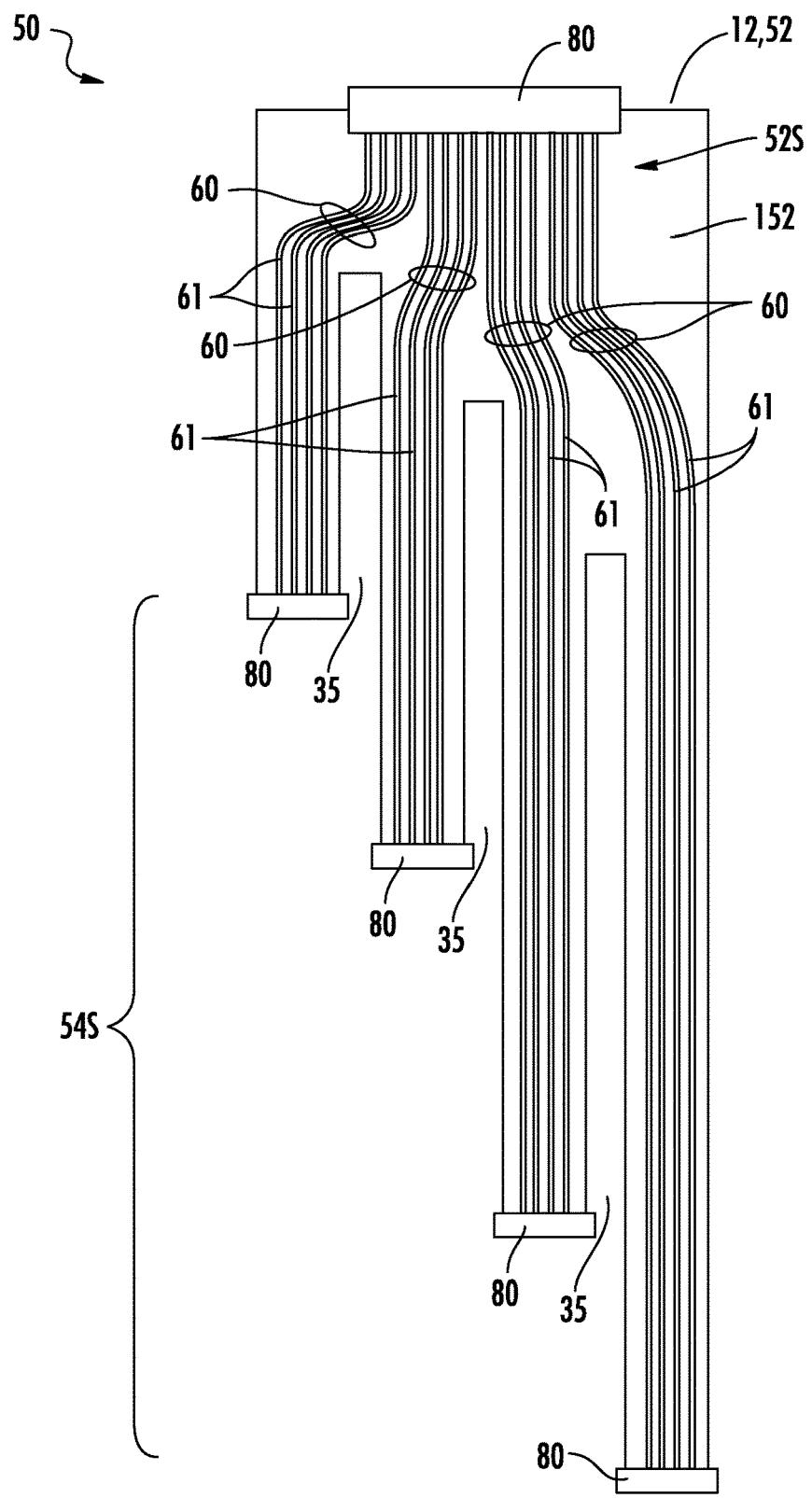
Figure 11C:
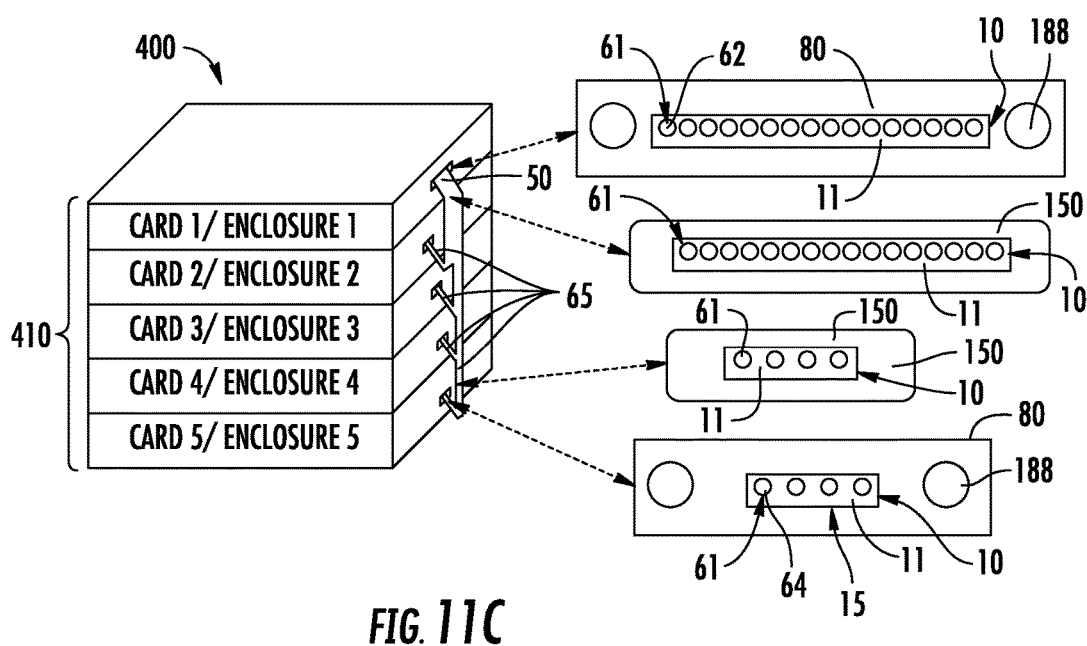
FIG. 11C is a schematic diagram of an example embodiment where the glass waveguide assembly of FIG. 11B is used as a flexible optical backplane connector between different cards of an optical communication system.

FIG. 11C is a schematic diagram of an example embodiment where the glass waveguide assembly 50 of FIG. 11B is used as a flexible optical backplane connector between different cards 410-1 through 410-5 of an optical communication system 400. The close-up insets in FIG. 11C show different cross-sections of glass waveguide assembly 50 at different locations as indicated. The glass waveguide assembly 50 has different cross-sectional profiles because of the different waveguide sections 65 and the protective coating 150. The thickness TH1 of the glass substrate 20 is constant, but it need not be so. The example glass waveguide assembly 50 shows a cable configuration of a fan-out waveguide cable with front-end connector 80 for card 410-1 having 16 channels going to four separate connectors 80 each having 4 channels to connect with cards 410-2 through 410-5. In an example, the optical communication system 400 can comprise a rack and the cards 410 can comprise blades that are stored in the rack.

Glass Waveguide Assembly and OE-PCB Fabrication Methods and Considerations

As discussed above, glass waveguide assembly 50 is formed from glass substrate 10. In an example, at least some portion of the glass substrate 10 of glass waveguide assembly 50 has thickness TH1 is between 20 microns and 500 microns or between 20 microns and 300 microns. More generally, the thickness TH1 can start out much larger, e.g., 50 to 1500 microns and then thinned by grinding, polishing, chemical etching, etc. after the glass waveguide assembly has been formed or partially formed.

The glass substrate 10 can also be cut, e.g. to form slots 35 to define waveguide sections 65. The cutting can be performed by laser. The glass substrate 10 can also undergo drilling to form certain types of OE-PCB components and features 110, such as vias, holes, perforations and cut-outs.

The array 60 of waveguides 61 can be formed in glass substrate 10 by an ion-exchange process, by laser writing, or by a combination of ion-exchange and laser writing. The ion-exchange can be single or multi-step thermal or field-assisted ion-exchange with or without a mask layer for defining the waveguide layout.

The waveguide layout can be defined by a mask layer formed on top surface 12 of glass substrate 10 or through the position of the laser focus by sequential laser writing. Both technologies integrate waveguides 61 in the bulk glass (body 11) with a defined distance dC to the top surface 12 (see, e.g., FIGS. 2A and 3A). The waveguides 61 can be straight waveguides, curved waveguide, etc., and can include optical features or components 100 such as tapers, crossings, splitters, combiners, and arcs. For example, waveguide arrays 60 can be formed as fan-out arrays or fan-in arrays.

One or both ends 62 and 64 of waveguides 61 can be terminated with a mechanical device or connector or other mechanical or optical features. Likewise, OE-PCB features or components 110, such as alignment features, fiducials, etc. as described above can be added at this point. In an example, each connector 80 is sized as a conventional MT connector. Thus, in an example, the thickness TH1 glass substrate 10 at connector regions 15 can be 20 microns to 300 microns. As shown in FIGS. 5A and 5B, if this thickness TH1 is not sufficient to fill interior 186 of connector housing 180, a cover member 170 can be used to fill in the empty space. The cover member 170 can be formed from glass or the same material used for the connector housing (e.g., a polymer).

The protective coating 150 can then added to the processed glass substrate 10. The protective coating 150 can be formed from an organic material (e.g. acrylate) or an inorganic material (sol gel, glass deposition). The protective coating 150 can be formed as a cladding and/or coating, or as an organic and inorganic hybrid adhesive cladding and/or coating (e.g., Siloxane). The protective coating 150 can serve as an optical top cladding for waveguides 61 to enhance the waveguiding properties of the waveguides. The protective coating 150 serves to make the glass waveguide assembly 50 mechanically robust and protect against adverse environment conditions and mechanical stress. The protective coating 150 can be applied by spray-coating, dipping, lamination, doctor-blade deposition, or a combination of these processes. The protective coating 150 can be formed from a single material as a single layer or can be formed of different materials making up different layers.

In an example, protective coating 150 includes a mechanically and thermally reliable material like resin, polymer, acrylate, silicone, BCB, Ormocer or Siloxane that can withstand thermal processes like PCB lamination, which can have a peak temperatures of 200° C., or other PCB assembly processes that can have peak temperatures of 260° C. or even higher.

In one example, protective coating 150 is has a uniform thickness TH2 and surrounds the entire glass substrate 10, with the optional exception of connector region(s) 15. In another example, the protective coating 150 has a varying thickness TH2, e.g., is thicker on one side of the glass substrate 10 than the other. In some examples, portions of protective coating 150 are removed to provide access to waveguides 61 and optical features or components 100 or OE-PCB features or components 110. As noted above, the OE-PCB features or components 110 can be formed as holes, slots and cut-outs for electrical vias, mechanical mounting or for assembly or attachment of other parts or components. In an example, at least one OE-PCB feature or component is selected from the group of features comprising: an insulating via, a conducting via, a through hole, a perforation, a conducting line, a conducting pad, a slot, a cut-out, a filed cut-out, a fiducial, and an alignment mark.

In an example, protective coating 150 can be made of a photoresist material and can be patterned by lithography and wet-chemical processing, by laser ablation of material, micro-machining or other techniques.

Once protective coating 150 is added to the processed glass substrate 10, it can then be further processed, e.g., cut to have a final outer shape, preparing (e.g., polishing) front end 52 and back end 54 to form optical-quality end faces 62 and 64 for waveguides 61, drilling vias and cut-outs and other OE-PCB features or components 110 needed for interfacing or incorporating glass waveguide assembly 50 into PCB 200 in forming the final OE-PCB 300.

In an example, the front and/or back ends 62 and 64 of waveguides 61 are terminated with alignment features 188, connectors 80 or connectors 80 that include microlens arrays 250 to support simplified passive and low cost optical interconnection. The alignment features 188 can include alignment pins or alignment holes or both alignment pins and alignment holes.

Also in an example, OE-PCB features or components 110 in the form of metal layers (copper) or electrical circuit patterns are added to either top surface 12 of glass substrate 10 or top surface 152 of protective coating 150 using deposition techniques known in the art, e.g., by direct deposition (e.g. sputter, e-less platting) or by lamination (e.g. copper resin) or by 3D printing or by using photolithographic patterning and etching techniques. The metal layers 110 can include copper, gold, chrome, titan, titan-tungsten for increasing bonding strength.

In an example, glass substrate 10 or the coated glass waveguide assembly 50 is processed (e.g., cut and drilled) based on the design requirements for the OE-PCB 300. For example, for embodiments involving embedding glass waveguide assembly 50 in a PCB 300, the outer dimension can be rectangular and be the same as standard PCB sheets like FR4 or resin-coated copper (RCC) that are used in PCB fabrication. Terminating waveguides 61 can be accomplished by cutting across the waveguides and using a score and break process or a full body laser cutting process to achieve suitable end-face optical quality. In the case of laser cutting or mechanical sawing or milling, top surface 12 of glass substrate 10 can be post-processed for surface quality improvement using for example chemical etching, thermal laser processing or mechanical polishing.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A glass waveguide assembly, comprising:
a glass substrate comprising a body with a front-end section having a front end, a back-end section having a back end, a top surface extending parallel to an X-Y plane of the glass substrate, a bottom surface extending parallel to an X-Y plane of the glass substrate;
a waveguide array comprising a plurality of glass optical waveguides formed within a glass matrix of the body of the glass substrate, the glass optical waveguides running from the front-end section to the back-end section of the glass substrate and comprising respective optical end faces at the back end section of the glass substrate;
slots cut out of the back end of the glass substrate from the top surface of the glass substrate to the bottom surface of the glass substrate along an X-Z plane of the glass substrate to create waveguide sections in respective connector regions of the glass waveguide assembly, the slots separating the connector regions of the glass waveguide assembly along a direction X in the X-Z plane of the glass substrate;
a multi-fiber optical connector formed at or adjacent the back end of the glass substrate in each of the connector regions, each multi-fiber optical connector terminating the plurality of glass optical waveguides of the waveguide array at the respective optical end faces of the glass optical waveguides at the back end section of the glass substrate to provide optical communication to the plurality of glass optical waveguides formed within the glass matrix of the body of the glass substrate.

2. The glass waveguide assembly according to claim 1, wherein the multi-fiber optical connectors comprise connector portions that are displaced from the connector regions of the glass waveguide assembly along the direction X and reside in the slots of the glass substrate.

3. The glass waveguide assembly according to claim 2, wherein the body has a substantially constant thickness in the range between 20 microns and 500 microns and a length measured between the front end and the back end in the range of between 2 centimeters and 10 centimeters.

4. The glass waveguide assembly according to claim 2, wherein the connector portions residing in the slots of the glass substrate comprise alignment features to dictate alignment of optical fibers with the multi-fiber optical connectors.

5. The glass waveguide assembly according to claim 2, wherein the multi-fiber optical connectors comprise a connector housing defining a U-shaped interior section and a cover member sized to fit within the U-shaped interior section so that it is flush with a top surface of the connector housing with one of the waveguide section connector regions of the glass substrate positioned in the U-shaped interior section and covered by the cover member.

6. The glass waveguide assembly according to claim 1, wherein the body is flexible to form a bend section having a bend radius in the range from 5 millimeters to 30 millimeters.

7. The glass waveguide assembly according to claim 6, wherein the bend section causes the front-end section and the back-end section of the glass substrate to reside in parallel planes separated by a distance of no greater than 4 millimeters.

8. The glass waveguide assembly according to claim 1, wherein the waveguide sections are independently flexible.

9. The glass waveguide assembly according to claim 1, further comprising a protective coating formed over at least a portion of the top surface of the glass substrate adjacent to the at least one glass optical waveguide and a protective coating covering the bottom surface of the glass substrate at least up to the at least one connector region.

10. The glass waveguide assembly according to claim 9, wherein the protective coating does not cover the at least one connector region.

11. The glass waveguide assembly according to claim 1, wherein the glass substrate comprises an ion-exchangeable material.

12. The glass waveguide assembly according to claim 1, wherein the glass substrate comprises a $K^{30}$ ion-exchanged glass.

13. The glass waveguide assembly according to claim 1, further comprising at least one conducting feature formed either on the top surface of the glass substrate or on a top surface of the protective coating.

14. The glass waveguide assembly according to claim 1, further comprising at least one of a hole, a perforation, a through hole and a polymer-filled via.

15. The glass waveguide assembly according to claim 1, further comprising at least one of a cut-out and a polymer-filled cut-out.

16. The glass waveguide assembly according to claim 1, wherein the multi-fiber optical connector has an MT configuration.

17. The glass waveguide assembly according to claim 1, wherein the multi-fiber optical connector comprises a ferrule having an interior that encloses the connector region.

18. The glass waveguide assembly according to claim 1, wherein the multi-fiber optical connector comprises a microlens array having at least one microlens element disposed immediately adjacent an end of the at least one glass optical waveguide.

19. An optical-electrical printed circuit board (OE-PCB), comprising: the glass waveguide assembly according to claim 1; and a printed circuit board (PCB) that operably supports the glass waveguide assembly.

20. The OE-PCB according to claim 19, wherein the PCB operably supports a photonic integrated circuit (PIC) that includes at least one PIC waveguide, and wherein the glass waveguide assembly is operably supported adjacent a top surface of the PCB in a fly-over configuration such that the front-end section of the glass waveguide assembly includes a bend and wherein at least one glass optical waveguide of the plurality of glass optical waveguides is optically coupled to the at least one PIC waveguide.

21. The OE-PCB according to claim 19, wherein the PCB operably supports a photonic integrated circuit (PIC) that includes at least one PIC waveguide, and wherein the back-end section of the glass waveguide assembly is embedded within the PCB and the front-end section of the glass waveguide assembly includes a bend section and is disposed relative to the PIC such that at least one glass optical waveguide of the plurality of glass optical waveguides is optically coupled to the at least one PIC waveguide.

22. The OE-PCB according to claim 19, wherein: the PCB comprises conductive layers spaced apart by insulating and at least a portion of the glass waveguide assembly is embedded in the PCB, different conductive layers of the PCB being in electrical communication through at least one conductive via formed in the glass waveguide assembly; and the PCB operably supports a photonic integrated circuit (PIC) through an interposer, the PIC comprising at least one PIC waveguide, wherein at least one glass optical waveguide of the plurality of glass optical waveguides is in optical communication with the at least one PIC waveguide.

23. The OE-PCB according to claim 22, wherein the entire glass waveguide assembly is embedded within the PCB and wherein at least one glass optical waveguide of the plurality of glass optical waveguides is in optical communication with the at least one PIC waveguide through at least one optical via that includes at least one light-turning structure.

24. The OC-PCB according to claim 22, wherein the multi-fiber optical connector resides at or immediately adjacent an end of the PCB.

25. The OE-PCB according to claim 19, wherein: the PCB operably supports a photonic integrated circuit (PIC) that includes at least one photonic device; the back-end section of the glass waveguide assembly is embedded within the PCB and the front-end section includes a bend section and is disposed relative to the PIC such that at least one glass optical waveguide of the glass waveguide assembly is optically coupled to the at least one photonic device.

26. The OE-PCB according to claim 19, wherein: the PCB comprises conductive layers spaced apart by insulating layers; at least a portion of the glass waveguide assembly is embedded in the PCB and includes at least one conductive via; different conductive layers of the PCB are in electrical communication through the at least one conductive via; and a photonic integrated circuit (PIC) is operably supported by the PCB through an interposer, the PIC comprising at least one photonic device, and wherein at least one glass optical waveguide of the plurality of glass optical waveguides is in optical communication with the at least one photonic device.

27. The OE-PCB according to claim 19, wherein the multi-fiber optical connector comprises a ferrule that defines an MT configuration.

* * * * *